United States Patent
Yamazaki

(10) Patent No.: US 6,798,701 B2
(45) Date of Patent: Sep. 28, 2004

(54) SEMICONDUCTOR INTEGRATED CIRCUIT DEVICE HAVING DATA INPUT/OUTPUT CONFIGURATION VARIABLE

(75) Inventor: Akira Yamazaki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 58 days.

(21) Appl. No.: 10/368,604

(22) Filed: Feb. 20, 2003

(65) Prior Publication Data

US 2003/0214845 A1 Nov. 20, 2003

(30) Foreign Application Priority Data

May 17, 2002 (JP) ........................................ 2002-143446

(51) Int. Cl.$^7$ ................................................ G11C 7/00
(52) U.S. Cl. ............................ 365/189.05; 365/189.01; 365/201
(58) Field of Search ....................... 365/189.05, 189.01, 365/189.02, 189.06, 189.07, 189.08, 201

(56) References Cited

U.S. PATENT DOCUMENTS 4,236,205 A * 11/1980 Kindseth et al. ............. 711/137
4,807,121 A * 2/1989 Halford ........................ 710/53
6,671,815 B2 * 12/2003 Iwamura et al. ............. 713/324

FOREIGN PATENT DOCUMENTS

JP        07-130197        5/1995

OTHER PUBLICATIONS

Related US Patent Application Ser. No. 10/322,676, filed Dec. 19, 2002—(Our Reference 57454–811).

* cited by examiner

Primary Examiner—Gene N. Auduong
(74) Attorney, Agent, or Firm—McDermott Will & Emery LLP

(57) ABSTRACT

In an embedded DRAM core of which word configuration can be varied, a modifying circuit selects either word configuration designating information from a metal word configuration setting circuit setting the word configuration with metal slice or word configuration designating information stored in a register, and supplies the selected information to an I/O switch. The I/O switch sets an internal switch gate to a conductive or non-conductive state in accordance with the received word configuration information, and electrically sets a connection path of a preamplifier/write driver and a DQ buffer. A test can be performed while operating an embedded DRAM macro under an actual use condition.

10 Claims, 23 Drawing Sheets

: FULL I/O MODE

SELECT 2PWs BY IOSEL<3:0>

: HALF I/O MODE    SET OPERATION STATE BY DQSEL<3:0>

SELECT 1PW BY IOSEL<3:0>

: QUARTER I/O MODE    ONLY BF4n OPERATES BY DQSEL<3:0>

USED IN COMBINATION WITH PAE, WDE

USED IN COMBINATION WITH OE, WE TO GENERATE DQSEL<3:0>

TIC512

FIG. 18 PRIOR ART

| SIGNAL NAME | FUNCTION |
|---|---|
| CLK | CLOCK SIGNAL |
| CKE | CLOCK ENABLE SIGNAL |
| /ACT | ROW ACTIVATING SIGNAL |
| /PRE | ROW INACTIVATING SIGNAL |
| /PEFA | AUTO-REFRESH INSTRUCTION SIGNAL |
| /RE | READ OPERATION INSTRUCTION SIGNAL |
| /WR | WRITE OPERATION INSTRUCTION SIGNAL |
| RA<12:0> | ROW ADDRESS SIGNAL |
| CA<3:0> | COLUMN ADDRESS SIGNAL |
| RAsp | ADDRESS SIGNAL FOR SPARE ROW SPACE ADDRESSING |
| CAsp | ADDRESS SIGNAL FOR SPARE COLUMN SPACE ADDRESSING |
| Q<127:0> | READ DATA |
| D<127:0> | WRITE DATA |
| SQ<1:0> | SPARE READ DATA |
| SD<1:0> | SPARE WRITE DATA |

FIG. 19 PRIOR ART

| SIGNAL NAME | FUNCTION |
|---|---|
| TCLK | CLOCK SIGNAL |
| TCKE | CLOCK ENABLE SIGNAL |
| /CS | CHIP SELECT SIGNAL |
| /RAS | ROW ADDRESS STROBE SIGNAL |
| /CAS | COLUMN ADDRESS STROBE SIGNAL |
| /WE | WRITE OPERATOIN INSTRUCTION SIGNAL |
| AD<12:0> | ROW/COLUMN ADDRESS |
| ADsp | ADDRESS SIGNAL FOR SPARE SPACE ADDRESSING |
| TQ<7:0> | READ DATA OUTPUT SIGNAL |
| TQmbt | MULTI-BIT TEST RESULT OUTPUT SIGNAL |
| TD<7:0> | WRITE DATA INPUT SIGNAL |

FIG. 20 PRIOR ART

| MNEMONIC | TIC CONTROL SIGNAL | | | | DRAM CONTROL SIGNAL | | | | |
|---|---|---|---|---|---|---|---|---|---|
| | /CS | /RAS | /CAS | /WE | /ACT | /PRE | /REFA | /RE | /WR |
| DSEL | H | – | – | – | H | H | H | H | H |
| NOR | L | H | H | H | H | H | H | H | H |
| ACT | L | L | H | H | L | H | H | H | H |
| PRE | L | L | H | L | H | L | H | H | H |
| REFA | L | L | L | H | H | H | L | H | H |
| RE | L | H | L | L | H | H | H | L | H |
| WE | L | H | L | L | H | H | H | H | L |

128 I/O MODE: ALL METAL SWITCHES ARE NON-CONDUCTIVE

64 I/O MODE: MSWW2, MSWR2 ARE CONDUCTIVE, REMAINDERS ARE NON-CONDUCTIVE

32 I/O MODE: ALL METAL SWITCHES ARE CONDUCTIVE

SEMICONDUCTOR INTEGRATED CIRCUIT DEVICE HAVING DATA INPUT/OUTPUT CONFIGURATION VARIABLE

BACKGROUND OF THE INVENTION

1. Field of the Invention

The present invention relates to a semiconductor integrated circuit device, and particularly to a semiconductor integrated circuit device referred to as a system LSI a memory and a logic integrated on a common semiconductor substrate (chip). More specifically, the present invention relates to a configuration for externally testing an embedded memory allowing the number of input/output data bits to be varied with metal slicing.

2. Description of the Background Art

A DRAM-embedded system LSI having a DRAM (dynamic random access memory) and a logic device or a microprocessor integrated on a common semiconductor substrate (chip) has widely been used in recent years. Compared to a conventional system having a discrete DRAM and a logic device or a microprocessor mounted on a printed board with soldering or the like, such DRAM-embedded system LSI has following advantages.

(1) There is no restriction by a pin terminal. Therefore, width of a data bus between the DRAM and the logic device can be large, which will improve a data transfer rate, and accordingly, improve system performance.

(2) The data bus formed between the DRAM and the logic device is formed of on-chip interconnection lines, and the data bus has a capacitance smaller than the wires on the printed board. Therefore, an operation current in data transfer can be smaller, and high-speed data transfer can be achieved.

(3) A system is constituted by a single package. Accordingly, a data bus interconnection and a control signal interconnection are not needed externally, and an area occupied on the printed board can be smaller. Thus, the size of the system can be reduced.

FIG. 17 schematically shows an example of a configuration of a conventional DRAM-embedded system LSI. In FIG. 17, a DRAM-embedded system LSI 500 includes a logic 502 performing a prescribed processing, a DRAM macro 504 for storing at least data required by logic 502, and a logic external bus 508 connecting logic 502 to an external device via a pad group 518.

Logic 502 may be a dedicated logic device performing a prescribed processing, or may be a microprocessor, as far as it performs a process using the data stored in DRAM macro 504.

DRAM macro 504 includes a DRAM core 510 storing data, a test interface circuit (TIC) 512 for performing a test through external, direct access to DRAM core 510, and a selection circuit 517 for selecting either one of an internal logic bus 506 for logic 502 or an internal test bus 516 from test interface circuit 512, and connecting the selected one to an internal memory bus 515, which in turn is connected to DRAM core 510. Test interface circuit 512 is coupled to pad group 518 via an external test bus 514.

Buses 506, 508, 514, 515 and 516 each include signal lines transmitting a control signal, an address signal and data. Since there is no restrictive condition by the pin terminal, internal logic bus 506, internal memory bus 515 and internal test bus 516 can have a sufficient bus width.

Read data from DRAM core 510 is directly transferred to test interface circuit 512 and logic 502 without passing through select circuit 517. In FIG. 17, however, the transfer path of the internal read data is not shown for the sake of simplicity.

In FIG. 17, logic external bus 508 and external test bus 514 are shown both being coupled to pad group 518. External test bus 514 and logic external bus 508, however, may be configured so as to be selectively connected to common pads in accordance with a test mode instruction signal (not shown).

FIG. 18 shows, in a list, signals for DRAM core 510. In FIG. 18, DRAM core 510 receives, as operation control signals: a clock signal CLK; a clock enable signal CKE setting validity/invalidity of an internal clock signal in DRAM core 510; a row activating signal /ACT activating an internal row selecting operation; a row inactivating signal /PRE for driving a selected row to a non-select state; an auto-refresh instruction signal /REFA instructing refresh of memory cell data in DRAM core 510; a read operation instruction signal /RE instructing data read; and a write operation instructing signal /WR instructing a write data operation.

In addition, for addressing a memory cell, following signals are supplied to DRAM core 510: a row address signal RA<12:0> of 13 bits; a column address signal CA<3:0> of 4 bits; an address signal for spare row space addressing RAsp for designating a spare memory cell row; and an address signal for spare column space addressing CAsp for designating a spare column.

Address signal for spare row space addressing RAsp and address signal for spare column space addressing CAsp are used to access spare memory cells in DRAM core 510 to determine the spare memory cells to be defective/non-defective, in a test performed before fuse-programming of a defective address.

These address signals for spare space addressing RAsp and CAsp designate a spare memory cell space when they are at H level, and designate a normal memory cell space at L level.

Write data D<127:0> of 128 bits and spare data SD<1:0> of 2 bits are supplied to DRAM core 510, and read data Q<127:0> of 128 bits and spare data SQ<1:0> of 2 bits are output from the same. When a spare space is addressed, a spare memory cell for redundancy replacement is designated. The spare memory cell can directly be tested.

As shown in FIG. 18, DRAM core 510 has a larger number of input/output signals than a general-purpose DRAM of a discrete device. In this test operation as well, test interface circuit 512 generates signal/data as shown in FIG. 18 to DRAM core 510 in accordance with a signal supplied from an external tester.

If test interface circuit 512 transfers the signal/data shown in FIG. 18 to and from the external tester via pad group 518 using external test bus 514, the number of these signal/data lines will be larger than that of pins of the external tester, and a test could not performed. In addition, even if a test can be performed, the number of devices that can be measured simultaneously is reduced, and cost for the test increases, because one device to be tested requires a large number of signal lines/data lines.

Test interface circuit 512 is provided in order to reduce the number of pins required in the test, and to implement an external, direct access to DRAM core 510 to readily test the same.

FIG. 19 shows, in a list, external signals for test interface circuit 512. The signals shown in FIG. 19 are transferred between an external test apparatus and test interface circuit 512 via external test bus 514 shown in FIG. 17.

In FIG. 19, test clock signal TCLK and test clock enable signal TCKE are supplied to test interface circuit 512. Test clock signal TCLK and test clock enable signal TCKE are used in a test operation mode, instead of clock signal CLK and clock enable signal CKE supplied to DRAM core 510 in a normal operation mode.

Further, a chip select signal ICS, a row address strobe signal /RAS, a column address strobe signal /CAS, and a write operation instruction signal /WE are supplied to test interface circuit 512. A combination of logic levels, for example, at a rising edge of the test clock signal of these control signals including /CS, /RAs, /CAS and /WE, designates an operation mode of the DRAM core.

Test interface circuit 512 decodes these external control signals, and in accordance with the decoding result, selectively activates row activating signal /ACT, row inactivating signal /PRE, auto-refresh instruction signal /REFA, read operation instruction signal /RE, and write operation instruction signal /WE as shown in FIG. 18.

As an address signal, an address signal AD<12:0> of 13 bits and an address signal for spare space addressing ADsp are supplied to test interface circuit 512. A row address and a column address are applied via the same pads (terminals) in a time division multiplexed manner, and address signal for spare space addressing ADsp is applied for a spare row and a spare column also in a time division multiplexed manner.

As data, test write data TD<7:0> of 8 bits, test read data TQ<7:0> of 8 bits, and multi-bit test result output signal TQmbt of 1 bit are transferred between the external tester and test interface circuit 512.

Test interface circuit 512 expands bit width of test data TD<7:0> of 8 bits to data of 128 bits in test data writing, and supplies the resultant data to DRAM core 510 via selection circuit 517. In expanding the bit width of the test write data, test data TD<7:0> of 8 bits is repetitively copied to generate 128-bit data including sixteen 8-bit data of the same pattern.

In test data reading, test interface circuit 512 sequentially outputs, in a unit of 8 bits, 128-bit data read from DRAM core 510.

Multi-bit test result output signal TQmbt indicates a multi-bit test result regarding 128-bit test read data. Use of the multi-bit test result output signal TQmbt eliminates a need to individually determine 128-bit data to be defective/non-defective. Even if the data is output in a unit of 8 bits, a time for a test can be shortened by specifying defects only when the multi-bit result indicates a defect.

FIG. 20 shows a relation of an external control signal (a TIC control signal) applied to test interface circuit 512 with a control signal (a DRAM control signal) applied to DRAM core 510, in a form of a truth table.

In FIG. 20, a non-select state (DSEL) of DRAM macro 504 is set when chip select signal /CS is at H level. In this state, DRAM core 510 maintains the non-select state, irrespective of the logic levels of remaining control signals, that is, /RAS, /CAS and /WE.

When chip select signal /CS is set to L level, an operation mode to DRAM core 510 is designated.

In NOP where no operation mode is designated, control signals /RAS, /CAS and /WE are all set to H level. In such a state, control signals applied to DRAM core 510 all maintain H level, and a new operation mode to DRAM core 510 is not designated. Usually, DRAM core 510 maintains a stand-by state when an NOP command is applied.

When chip select signal /CS and row address strobe signal /RAS are both set to L level, and column address strobe signal /CAS and write operation instruction signal /WE are both set to H level, ACT instructing array activation is designated. In such a state, to DRAM core 510, row activating signal /ACT is set to an active state of L level. Remaining DRAM control signals each maintain an inactive state of H level.

Here, the logic level of the TIC control signal to test interface circuit 512 is determined at a rising edge or a falling edge of test clock signal TCLK.

When chip select signal /CS, row address strobe signal /RAS and write operation instruction signal /WE are set to L level, and column address strobe signal ICAS maintains H level, PRE instructing a precharge operation is designated. In such a state, row inactivating signal /PRE as the DRAM control signal is set to L level, and DRAM core 510 returns to a precharge state.

When chip select signal /CS, row address strobe signal /RAS and column address strobe signal /CAS are set to L level, and write operation instruction signal /WE is set to H level, REFA instructing a refresh operation is designated. In such a case, among the DRAM control signals, auto-refresh instruction signal /REFA is set to L level, and refresh is carried out in DRAM core 510.

When chip select signal /CS and column address strobe signal /CAS are both set to L level, and row address strobe signal /RAS and write operation instruction signal /WE are both set to H level, RE instructing data read is designated. In such a case, among the DRAM control signals, read operation instruction signal /RE is set to an active state of L level, and remaining DRAM control signals each maintain H level.

When chip select signal /CS, column address strobe signal /CAS, and write operation instruction signal /WE are set to L level, and row address strobe signal /RAS is set to H level, WE instructing data write is designated. In such a state, among the DRAM control signals, write operation instruction signal /WR is set to L level.

In test interface circuit 512, the TIC control signals are converted to the DRAM control signals in accordance with the truth table shown in FIG. 20. Address multiplexing, conversion of data bit width, and conversion of the control signals are performed in test interface circuit 512, thereby significantly reducing the number of pin terminals used when the external tester makes an access to DRAM core 510 for a test operation. In addition, the control signals applied to test interface circuit 512 is the same as those used for a normal, clock synchronous DRAM. Therefore, DRAM core 510 can be tested with a tester for a standard clock synchronous DRAM.

FIG. 21 schematically shows a configuration of DRAM core 510 and test interface circuit (TIC) 512 shown in FIG. 17. In FIG. 21, select circuit 517 arranged between DRAM core 510 and test interface circuit 512 is not shown for the sake of simplicity.

In FIG. 21, DRAM core 510 includes DRAM arrays 550e and 550w each having a plurality of memory cells arranged in rows and columns, and a decoder 552 selecting a memory cell from these DRAM arrays 550e and 550w in accordance with the address signal.

As an example, DRAM arrays 550e and 550w each have a storage capacity of 8 M bits.

In these DRAM arrays 550e and 550w, a spare row and a spare column for repairing a defective memory cell are provided.

Decoder 552 includes both of a row decoder for selecting a memory cell row and a column decoder for selecting a memory cell column in these DRAM arrays 550e and 550w.

In addition, DRAM core 510 includes a DRAM data path 556e for inputting/outputting data to/from DRAM array 550e, a DRAM data path 556w for inputting/outputting data to/from DRAM array 550w, and a DRAM control circuit 558 controlling an internal operation of DRAM core 510.

DRAM data paths 556e and 556w each include a write driver transferring internal write data to corresponding DRAM arrays 550e and 550w, and a preamplifier for amplifying memory cell data read from corresponding DRAM arrays 550e and 550w.

DRAM data path 556e transfers write data WD<127:64> via a write data bus 551e having a width of 64 bits, and receives internal read data RD<127:64> of 64 bits transferred from the DRAM array 550e via an internal read data bus 553e.

In this DRAM array 550e, a spare column is selected simultaneously with a normal column. Therefore, in repairing a defective column, DRAM data path 556e transfers spare write data SWD<1> via a spare write data line 557e, and receives read data SRD<1> from a spare memory cell via a spare read data line 559e.

Similarly, DRAM data path 556w transfers internal write data WD<63:0> to DRAM array 550w via an internal write data bus 551w having a width of 64 bits, and receives internal read data RD<63:0> of a width of 64 bits from DRAM array 550w via an internal read data bus 553w.

In addition, in repairing a defective column, DRAM data path 556w receives read data SRD<0> read from a spare column via a spare read data line 559w, and transfers write data SWD<0> to a spare column via a spare write data line 557w.

In repairing a defective column in a normal operation mode, DRAM data path 556e replaces a corresponding write data line in internal write data bus 551e with spare write data line 557e, and replaces spare read data line 559e with a corresponding internal read data line in internal read data bus 553e. Similarly, in repairing a defective column in the normal operation mode, DRAM data bus 556w replaces spare read data line 559w with a corresponding internal read data line in internal read data bus 553w, and replaces spare write data line 557w with a corresponding internal write data line in internal write data bus 551w.

In a test mode for repair determination before programming a defective address for repairing a defective column, a normal memory cell and a spare memory cell are tested, and whether the spare memory cell functions normally is tested. In a test of a memory for repair determination, spare read data lines 559e and 559w as well as spare write data lines 557e and 557w in DRAM data paths 556e and 556w transfer data to test interface circuit 512 without replacement by a normal data line.

Test interface circuit 512 includes TIC data paths 560e and 560w provided corresponding to DRAM data paths 556e and 556w respectively, and a TIC control circuit 562 transferring test write data TD<7:0>, test read data TQ<7:0>, and multi-bit test result indicating signal TQmbt to and from the external tester.

TIC control circuit 562 also receives from the external tester, address signals and control signals designating an operation mode as shown in FIG. 12. In FIG. 21, however, the control signal and the addressing signal supplied to TIC control circuit 562 are not shown for the sake of simplicity.

In test data writing, TIC data paths 560e and 560w each expand test write data TD<7:0> of 8 bits to test data of 64 bits, and transfer the resultant data to DRAM data paths 556e and 556w via corresponding data buses 561e and 561w.

In data reading, these TIC data paths 560e and 560w receive read data of 64 bits (read data of the total of 128 bits) from DRAM data paths 556e and 556w via data buses 563e and 563w, respectively.

TIC data path 560e receives data Q<127:64> of 64 bits from DRAM data path 556e via data bus 563e, and receives as spare data SQ<1> via spare read data line 569e, spare read data SRD<1> from spare internal read data line 559e transmitted via DRAM data path 556e.

This TIC data path 560e transfers write data D<127:64> of 64 bits via internal write data bus 561e to DRAM data path 556e, and transfers spare write data SD<1> to internal spare write data line 557e via a spare write data line 567e.

Similarly, TIC data path 560w receives internal read data Q<63:0> from DRAM data path 556w via read data bus 563w, and receives spare read data SQ<0> via spare data line 569w. In addition, this TIC data path 560w transfers data D<63:0> of 64 bits to DRAM data path 556w via write data bus 561w, and transfers spare write data SD<0> to DRAM data path 556w via a spare write data line 567w.

In data reading, TIC control circuit 562 sequentially outputs as test data TQ<7:0>, data of the total of 128 bits supplied to TIC data paths 560e and 560w in a unit of data of 8 bits. TIC control circuit 562 also transfers, via a multi-bit signal line 573, signal TQmbt indicating a multi-bit test result of the 128-bit data simultaneously read. When the multi-bit test result indicating signal TQmbt indicates mismatch, a defective memory cell is specified in the external tester in accordance with the test read data TQ<7:0> and expected value data.

FIG. 22 schematically shows a configuration of a main portion of DRAM arrays 550e and 550w. As DRAM arrays 550e and 550w have an identical configuration, FIG. 22 shows one DRAM array 550 as a representative.

In FIG. 22, DRAM array 550 includes a normal memory cell NMC arranged in rows and columns, and a spare memory cell SMC for repairing a defective normal memory cell. The spare memory cells SMC are also arranged in rows and columns, and normal memory cells NMC and spare memory cells SMC are arranged in an alignment in a direction of row. In FIG. 22, one normal memory cell NMC and one spare memory cell SMC are shown as a representative.

A word line WL is arranged in common to normal memory cells NMC and spare memory cells SMC aligned in a direction of row. A word line select signal is transmitted to word line WL from a row decoder included in decoder 552 shown in FIG. 21.

A pair of normal bit lines NBL and /NBL are arranged, corresponding to each column of normal memory cells NMC. Similarly, a pair of spare bit lines SBL and /SBL are arranged, corresponding to a column of spare memory cells SMC. In FIG. 22, only bit lines NBL and SBL are shown.

Extending to a direction of column, internal read data lines RDL0 to RDL63 and internal write data lines WDL0 to WDL63 are each arranged for a prescribed number of bit line pairs. Extending to a direction of column, spare read data line SRDL and internal spare write data line SWDL are arranged for spare memory cells SMC.

In order to select a memory cell, a write column select line WCSL transmitting a write column select signal in data writing and a read column select line RCSL transmitting a column select signal in data reading are arranged, extending in a direction of row. A write column select gate WSG arranged to a normal bit line NBL is rendered conductive by write column select line WCSL, to connect normal bit line NBL to a corresponding internal write data line WDL. In addition, in data reading, normal bit line is coupled to an internal read data line RDL via a read column select gate RSG in accordance with a signal on a read column select line RCSL. FIG. 22 shows, as a representative, read column select gate RSG and write column select gate WSG provided for internal read data line RDL0 and internal write data line WDL0.

For a spare bit line SBL as well, a spare write column select gate SWSG connecting spare bit line SBL to a spare write data line SWDL in accordance with a signal on write column select line WCSL, and a read column select gate SRSG connecting spare bit line SBL to an internal read data line SRDL in accordance with a column select signal on a read column select line RCSL are provided.

Column select lines WCSL and RCSL are arranged extending in a direction of row. Therefore, normal memory cells and a spare memory cell are always selected simultaneously, and memory cell data is read to internal read data lines RDL0 to RDL63 and spare read data line SRDL. In addition, in data writing, data are transmitted to internal write data lines WDL0 to WDL63 and spare write data line SWDL. In data writing, data is written in a defective column, as in the spare memory cell.

In decoder 552 shown in FIG. 21, a row decoder and a column decoder are arranged along the same direction so that multi-bit data interconnection lines WDL<127:0> and RDL<127:0> can be provided over a memory cell array, and an array area can be reduced. A configuration in which the row and column decoders are arranged along the same direction is commonly used in a DRAM macro merged with a logic.

FIG. 23 schematically shows an arrangement of a sense amplifier for one write data line and one read data line. In FIG. 23, a sense amplifier group SAG including sixteen sense amplifiers is arranged for internal read data line RDL and internal write data line WDL. One of sixteen sense amplifiers included in sense amplifier group SAG is selected by column address CA<3:0> of 4 bits. Therefore, sixteen columns of spare memory cells SMC are also provided for one spare data line. The sense amplifiers are arranged corresponding to the respective bit line pairs, and senses, amplifies and latches memory cells data of the corresponding bit line pairs when activated.

Usually, DRAM array 550 is divided into sixteen row blocks, and 512 word lines are arranged in each row block. One word line is selected in one row block by a row address RA<12:0> of 13 bits. In order to repair a defective memory cell row, a spare row is similarly provided. For an arrangement of the spare row, spare word lines may be provided in each row block, or may be concentrated in a specific row block.

FIG. 24 schematically illustrates a manner of repairing a defective column. One DRAM array is divided into a plurality of row blocks. FIG. 24 shows two row blocks RBi and RBj. In the DRAM array, extending in common to row blocks in a direction of column, internal read data lines RDL0 to RDL63, internal write data lines WDL0 to WDL63, spare read data line SRDL, and spare write data line SWDL are provided.

If a memory cell associated with an internal read data line RDLa and an internal write data line WDLa is defective in row block RBi, the internal read data line RDLa and internal write data line WDLa are replaced with spare read data line SRDL and spare write data line SWDL. On the other hand, if a memory cell associated with an internal read data line RDLb and an internal write data line WDLb is defective in row block RBj, internal read data line RDLb and internal write data line WDLb are replaced with spare read data line SRDL and spare write data line SWDL.

Therefore, when a row block is specified, an internal read data line or an internal write data line to be replaced is uniquely determined. Repairing of a defective memory cell is performed in units of data lines. Thus, even when column select lines, that is, the write column select lines and the read column select lines, extend in the row direction, and the spare memory cell and the normal memory cells are also simultaneously selected, a defective memory cell can be repaired through accurate redundancy replacement.

FIG. 25 schematically shows a configuration of DRAM data paths 556e and 556w shown in FIG. 21. Since DRAM data paths 556e and 556w have the same configuration, FIG. 25 shows a DRAM data path 556 as a representative.

In FIG. 25, DRAM data path 556 includes preamplifiers PA0 to PA63 provided respectively for internal read data lines RDL0 to RDL63, write drivers WV0 to WV63 arranged corresponding to internal write data lines WDL0 to WDL63 respectively, a spare preamplifier SPA arranged corresponding to spare read data line SDL, and a spare word driver SWV arranged corresponding to spare write data line SWDL.

In data reading, preamplifiers PA0 to PA63 and SPA are simultaneously activated by a not-shown control circuit (a DRAM control circuit 558). In data writing, write drivers WV0 to WV63 and SWV are also activated in parallel by a not-shown control circuit (the DRAM control circuit). When redundancy replacement is not carried out, spare write driver SWV may maintain an inactive state.

DRAM data path 556 further includes a redundancy control circuit CRC generating a select signal for redundancy replacement in accordance with a spare column check test mode instruction signal SPCC and a row block address RB, multiplexers (MUX) MX0 to MX63 provided corresponding to preamplifiers PA0 to PA63 respectively and selecting either one of output data of corresponding preamplifiers PA0 to PA63 and output data of spare preamplifier SPA in accordance with select signals RSEL0 to RSEL63 from redundancy control circuit CRC, read data latches RLH0 to RLH63 latching and transferring output data of respective multiplexers MX0 to MX63 in accordance with a not-shown clock signal, and output buffers OBF0 to OBF63 buffering the output data of respective read data latches RLH0 to RLH63 to generate read data Q0 to Q63.

Spare column check test mode instruction signal SPCC is activated in a test of the memory for repair determination performed before programming an address of a defective memory cell. In testing the memory for repair determination, whether a spare memory cell is defective/non-defective is tested. Spare addressing signals RAsp and CAsp are used in this test of the memory for repair determination.

When spare column check test mode instruction signal SPCC is inactive, redundancy control circuit CRC generates read select signals RSEL0 to RSEL63 so as to replace a defective read data line programmed for each row block, if any, with a spare read data line in accordance with row block address RB.

When spare column check test mode instruction signal SPCC is active, redundancy control circuit CRC sets all select signals RSEL0 to RSEL63 to an inactive state, and causes multiplexers MX0 to MX63 to select output data of corresponding preamplifiers PA0 to PA63, respectively.

DRAM data path 556 further includes a spare read data latch SRLH latching and transferring output data of spare preamplifier SPA in accordance with a not-shown clock signal when a test mode instruction signal TE is active, and a spare output buffer SOBF buffering output data of spare read data latch SRLH to generate spare read data SQ. An output state of spare read data latch SRLH may be set so as to set spare output buffer SOBF to an output high impedance state when spare column check test mode instruction signal SPCC is inactive. Alternatively, spare output buffer SOBF may be set to the output high impedance state when spare column check test mode instruction signal SPCC is inactive.

DRAM data path 556 further includes input buffers IBF0 to IBF63 provided corresponding to write data D0 to D63 respectively, write data latches WLH0 to WLH63 provided corresponding to input buffers IBF0 to IBF63 respectively, latching output data of corresponding input buffers IBF0 to IBF63 in accordance with a not-shown clock signal, and transferring the latched data to corresponding write drivers WV0 to WV63, a multiplexer MX70 for selecting one of the output data of input buffers IBF0 to IBF63 in accordance with select signals WSEL0 to WSEL63 from redundancy control circuit CRC, a spare input buffer SIBF buffering spare write data SD, a multiplexer MX71 selecting either output data of multiplexer MX70 or output data of spare input buffer SIBF in accordance with spare column check test mode instruction signal SPCC, and a spare write data latch SWLH latching output data of multiplexer MX71 in accordance with a not-shown clock signal and transferring the resultant data to spare write driver SWV.

When spare column check test mode instruction signal SPCC is inactive, multiplexer MX71 selects the output data of multiplexer MX70, for transference to spare write data latch SWLH. When spare column check test mode instruction signal SPCC is activated, multiplexer MX71 selects the output data of spare input buffer SIBF for transference to spare write data latch SWLH. Spare input buffer SIBF may be set to the output high impedance state when spare column check test mode instruction signal SPCC is inactive.

In DRAM data path 556, in the normal operation mode, redundancy replacement (data line replacement) for repairing a defective column is performed under the control of redundancy control circuit CRC. In other words, in data reading, multiplexers MX0 to MX63 replace the output data of a preamplifier corresponding to a defective read data line with the output data of spare preamplifier SPA in accordance with select signals RSEL0 to RSEL63 output by redundancy control circuit CRC. Meanwhile, in data writing, the write data transferred to the defective write data line is transferred to spare write data latch SWLH by multiplexers MX70 and MX71, and then transferred to spare write data line SWDL by spare write driver SWV.

In such a case, although the data is written in the defective column, there is caused no problem because a defective read data line for a defective memory cell is replaced with the spare read data line in data reading.

In addition, when redundancy replacement is not performed, multiplexer MX70 does not select data line. In such a case, even if spare word driver SWV is configured to write an invalid data into the spare memory cell, there is cased no problem. This is because redundant replacement is not carried out during the access to this row block and the invalid data written into the spare memory cell is not accessed.

In data reading in the test operation mode for repair determination before programming a defective address, redundancy control circuit CRC sets all select signals RSEL0 to RSEL63 to an inactive state, and multiplexers MX0 to MX63 select output data of corresponding preamplifiers PA0 to PA63 respectively. Moreover, in the test operation mode for repair determination, spare read data latch SRLH is activated, and the output data of spare preamplifier SPA is transferred and spare read data SQ is generated by spare data buffer SOBF.

In data writing in the test operation mode for repair determination, input data SP of spare input buffer SIBF is selected by multiplexer MX71, to be transmitted to spare write driver SRV via spare write data latch SWLH.

Therefore, in the test operation mode for repair determination, the spare read data line and the spare write data line can be accessed directly from the outside of the DRAM core.

FIG. 26 schematically shows a configuration of a portion associated with data writing of TIC data paths 556e and 556w shown in FIGS. 21. FIGS. 26 also shows a configuration of a portion generating write data of TIC control circuit 562.

TIC control circuit 562 includes a cycle shift circuit 600 transferring test data TD<7:0> of 8 bits in accordance with test clock signal TCLK. Cycle shift circuit 600 outputs the received test data TD<7:0>, with a delay by a prescribed number of cycles of test clock signal TCLK.

Address signal AD<12:0> of 13 bits and address signal for spare address space addressing ADsp are also applied to TIC control circuit 562.

Data Df<7:0> of 8 bits synchronous with test clock signal TCLK is generated from cycle shift circuit 600.

TIC data path 560e includes drive circuits DRE0 to DRE7 each copying data Df<7:0> to generate 8-bit data, and a driver SDRe copying data Df<7:0> to generate spare data SD<1>.

Drive circuits DRE0 to DRE7 each include drivers of 8 bits, and generate 8-bit data D<64:71>, D<72:79>, . . . and D<120:127>, respectively. Each of these 8-bit data D<64:71>, D<72:79>, . . . and D<120:127> has the same pattern as data Df<7:0>.

Driver SDRe is constituted with a drive circuit of 1 bit, and buffers data Df<7> to generate spare write data SD<1>.

Similarly, TIC data path 560w each includes drive circuits DRW0 to DRW7 copying data Df<7:0> to generate data of 8 bits, and driver SDRw buffering data Df<7> to generate spare data SD<0>.

Eight-bit data D<7:0>, D<15:8>, . . . and D<63:56> are generated from drive circuits DRW0 to DRW7, respectively. Eight-bit data generated from data path 560w all have the same pattern.

Here, the data pattern of test data TD<7:0> is expanded to 128-bit data so as to meet the following condition.

D<8·n+m>=TD<m>, where n is an integer from 0 to 15, and m is an integer from 0 to 7.

By copying data Df<7:0> in TIC data paths 560e and 560w, 128-bit internal data can be generated from 8-bit external data for transmission to the DRAM core, and spare write data SD<0> and SD<1> can be transferred to the DRAM core. Spare write data SD<0> and SD<1> have the logic level similar to test data TD<7>.

FIG. 27 schematically shows a configuration of a data read portion of TIC data paths 560e and 560w shown in FIG.

21. Since TIC data paths 560e and 560w have the same configuration, FIG. 27 shows specifically the configuration of TIC data path 560w, and that of TIC data path 560e is simply shown in a block form.

TIC data path 560w includes unit processing circuits UPW0 to UPW7 arranged corresponding to 8-bit data Q<7:0> to Q<63:56> respectively, and a tristate buffer 600e provided for spare read data SQ<0>. These unit processing circuits UPW0 to UPW7, having the same configuration, each include a tristate buffer circuit 610 buffering corresponding 8-bit data Q to generate internal data TQf<7:0> when activated, and a comparison circuit 612 comparing corresponding 8-bit internal read data Q with expected value data CMPD<7:0> and compressing the comparison result into 1-bit data for output.

Tristate buffer circuit 610 is activated in accordance with a corresponding select signal QSEL among a 16-bit select signal QSEL<15:0> generated from TIC control circuit 562 in accordance with an address signal. Tristate buffer 600w is selectively activated in accordance with a select signal SQSEL<0> from the TIC control circuit.

TIC data path 560e includes a tristate buffer circuit 600e provided for spare data SQ<1>, and unit processing circuits UPE0 to UPE7 provided respectively for 8-bit data Q<64:71> to Q<120:127>. These unit processing circuits UPE0 to UPE7 are also selectively activated in accordance with a corresponding select signal among 16-bit select signal QSEL<15:0>.

These unit processing circuits UPE0 to UPE7 each include a tristate buffer circuit buffering the corresponding 8-bit data to generate internal read data TQf<7:0> when activated, and comparison circuit 612 performing a multi-bit test of detecting match/mismatch between the respective data bits and expected value data CMPD<7:0>.

Comparison circuit 612 compares 8-bit expected value data CMPD<7:0> with corresponding 8-bit data D<8·n+7:8·n> for each bit, and further compresses the 8-bit signal of the result of bit by bit comparison into a 1-bit signal Qmbtf<n>. Signal Qmbtf<15:0> of 16 bits indicating the comparison result from comparison circuit 612 is further compressed in TIC control circuit 562, and 1-bit multi-bit result indicating signal TQmbt is generated for transference to the external tester. In compression, it is simply determined whether or not the logic level of each bit of 16-bit signal Qmbtf<15:0> indicates a normal state (an AND operation is performed).

FIG. 28 schematically shows a configuration of a portion, generating a select signal shown in FIG. 27 in TIC control circuit 562. In FIG. 28, TIC control circuit 562 includes a flip-flop 620 for transferring address signals AD<12:0> and ADsp in synchronization with test clock signal TCLK to generate internal address signals intAD<12:0> and intADsp, a flip-flop 621 for further transferring internal address signals intAD<12:0> and intADsp from flip-flop 620 in synchronization with test clock signal TCLK to generate row address signal RA<12:0> and address signal for spare row addressing RAsp, a flip-flop 622 for transferring 4-bit address signal intAD<3:0> from flip-flop 620 in synchronization with test clock signal TCLK to generate column address signal CA<3:0>, flip-flops 623–625 cascaded in three stages and transferring 4-bit internal address signals intAD<9:6> and intADsp from flip-flop 620 in synchronization with test clock signal TCLK, and a decoder 626 for decoding an output signal of flip-flop 625 to generate the select signals QSEL<15:0> and SQSEL<1:0>.

The reason for arranging 3-stage flip-flops 623 to 625 in a preceding stage of decoder 626 is to delay the output signal of decoder 626 by a time period comparable to a latency in test data reading. The latency represents a time period required from a time point when a read operation instruction signal instructing data read is supplied from test interface circuit 512 to DRAM core 510 to a time point when the test data is read from DRAM core 510 and transmitted to test interface circuit 512. Here, the latency is assumed to be 2.

Flip-flops 620 to 625 output signals in synchronization with a rising edge of test clock signal TCLK, respectively.

FIG. 29 is a timing diagram representing an operation in reading test data of the DRAM macro shown in FIGS. 21 to 28. In the following, a reading operation of the test data of the DRAM macro will be described with reference to FIG. 29.

Test interface circuit (TIC) 512 transfers external control signals to DRAM core 510, with a delay by 1 clock cycle of test clock signal TCLK. Therefore, in DRAM core 510, the control signal and the address signal are taken in at the rising edge of test clock signal TCLK after two clock cycles since the control signal and others are supplied from the tester to test interface circuit 512, and an internal operation is carried out. Here, in FIG. 29, clock signal CLK and test clock signal TCLK supplied to DRAM core 510 are assumed to have the same waveforms.

At time T1, a control signal ACT instructing row activation is supplied, and 13-bit row address signal RA(k) is supplied concurrently. Test interface circuit (TIC) 512 decodes the externally applied control signal, and transfers the row activating signal ACT to DRAM core 510 in accordance with the decode result, in synchronization with the rising edge of clock signal TCLK. As shown in FIGS. 18 and 20, although the control signal applied to the DRAM core is a signal of a negative logic, in FIG. 29, mnemonics shown in FIG. 20 are used to represent an operation mode instruction signal.

Here, as shown in FIG. 28, row address signal RA(k) is transferred from flip-flop 621 in synchronization with the rising edge of test clock signal TCLK.

At time T3, row activating signal ACT is taken in DRAM core 510 along with row address signal RA(k) in synchronization with the rising edge of clock signal CLK, and a row select operation is internally executed.

At time T2, a write operation instruction signal instructing data write is provided to test interface circuit (TIC) 512 along with column address signal CA(m) and test data TD(m), and control signal, column address signal and test data are taken in test interface circuit (TIC) 512 in synchronization with the rising edge of test clock signal TCLK.

The control signals are decoded within test interface circuit (TIC) 512, and write operation instruction signal WRITE for DRAM core 510, column address signal CA(m), and test data TD(m) are transferred to DRAM core 510 in synchronization with the rising edge of clock signal TCLK at time T3.

Write operation instruction signal WRITE, column address signal CA(m), and data D(m) are taken in DRAM core 510 in synchronization with the rising edge of clock signal CLK at time T4, to execute a column select operation, and data D(m) of 128 bits is written in columns designated by column address CA(m).

At time T3, a command (READ) instructing data read is supplied to test interface circuit (TIC) 512 along with column address signal CA(n) and test data TD(n). Test data TD(n) in data reading is used as expected value data CMPD<7:0> for comparison in the data path in test interface circuit 512.

Test data TD(n) supplied to test interface circuit (TIC) 512 at T3 is not transferred to the DRAM core because the write operation is not executed in the TIC data path. In particular, at a timing shown in FIG. 29, the comparison data (expected value data) is generated by internally shifting data supplied from the external tester by a prescribed number of cycles, considering a column latency in data reading, and is supplied to comparison circuit 612 provided in test interface circuit (TIC) 512. Therefore, in the input of the comparison data, write data written in response to the write command is transferred within test interface circuit (TIC) 512 to the DRAM core. Thus, even if the write data is supplied to test interface circuit (TIC) 512 along with the read command, there is caused no problem.

On the other hand, if comparison data CMPD<7:0> is required to be input in a cycle before read command application due to restriction of the number of delay stages in internal generation of comparison data, there will be a restriction that the write operation is not allowed in the input cycle for comparison data.

The command (READ) supplied to test interface circuit (TIC) 512 at time T3 is decoded in test interface circuit 512, and a read operation instruction signal READ is generated. In synchronization with the rising edge of test clock signal TCLK at time T4, read operation instruction signal READ (/RE) and column address signal CA(n) are supplied to DRAM core 510. Here, the command is used in the mnemonics previously shown in FIG. 20 as an instruction for an operation mode given by a combination of a plurality of control signals.

In DRAM core 510, in synchronization with the rising edge of clock signal CLK at time T5, column select operation is carried out in accordance with read operation instruction signal READ and column address signal CA(n), and the test data is internally read.

At time T4, control signals (PRE) instructing a precharge operation are supplied to test interface circuit (TIC) 512, the control signal are decoded in test interface circuit 512, and a row inactivation instruction signal PRE is transferred to DRAM core 510. At time T6, row inactivation instruction signal PRE is taken in DRAM core 510, and the internal precharge operation is performed.

In DRAM core 510, data internally read in response to read operation instruction signal READ supplied at time T5, with a column latency of 2 cycles, is read out externally in a clock cycle starting from time T6. At time T7, read data Q(n) is supplied to test interface circuit (TIC) 512.

In test interface circuit 512, in the clock cycle starting from time T6, buffer circuit 610 is selectively activated in accordance with a select signal from decoder 626 shown in FIG. 28 to generate 8-bit data from 128-bit data Q(n) transferred from DRAM core 510. In addition, in comparison circuit 612, data TD(n) taken in at time T3 is compared with the read data, and a signal indicating the comparison result is generated by time T7.

In a clock cycle starting from time T7, test interface circuit (TIC) circuit 512 outputs 8-bit test data TQ(n) along with multi-bit test result indicating signal Qmbt(n). Decoder 626 and flip-flops 620–625 shown in FIG. 28 constantly operate in synchronization with test clock signal TCLK. Therefore, when address signals intAD<9:6> and ADsp shown in FIG. 28 are sequentially supplied in each clock cycle, 8-bit data is sequentially selected in accordance with select signals QSEL<15:0> and SQSEL<1:0> output by decoder 626, and the selected data is read out from test interface circuit 512.

Decoder 626 may include an address counter, which internally performs count operation in synchronization with test clock signal TCLK to generate a column address, and may decode the column address to generate select signals QSEL<15:0>.

In the external tester, when multi-bit test result indicating signal Qmbt(n) indicates mismatch with respect to 8-bit test data TQ(n), test expected value data TD(n) is compared with test read data TQ(n) for each bit, and a position of a defective memory cell is specified. Multi-bit result indicating signal TQmbt indicates match/mismatch of the 128-bit data simultaneously selected. When multi-bit test result indicating signal TQmbt(n) indicates match, each bit of 128-bit test data TQ(n) is determined all being normal. The time for the test is shortened because it is not necessary to specify a position of a defective memory cell for each 8-bit test data with respect to all 8-bit data in the external tester.

DRAM macro 504 is integrated on the same semiconductor chip as logic 502 demanding a variety of specifications. Therefore, DRAM core 510 is required to cover the variety of specifications of logic (user logic) 502. The specifications required by the user logic are different in memory storage capacity, the number of banks, page size, the number of I/Os (input/output data bits), and others. Among the above, for the number of input/output data bits (the number of I/Os or a word configuration), for example, data paths 556w and 550e of DRAM core 510 are configured to enable switching of the number of input/output data bits with a metal slicing process.

FIG. 30 schematically shows a configuration of an IO switching portion of data paths 556w and 556e of the DRAM core with the word configuration variable. Data paths 556w and 556e have the same configuration for switching the word configuration, and the switching portion of data path 556 is representatively shown. In FIG. 30, DRAM data path 556 includes preamplifiers/write drivers PW0 to PW127 generating internal write/read data, and DQ buffers BF0 to BF127 coupled to memory data bus 515.

Each of preamplifiers/write drivers PW0 to PW127 includes preamplifier PA and write driver WV shown in FIG. 25. In data writing, a preamplifier/write driver PWi generates write data WD<i>, and in data reading, amplifies internal read data RD<i> read from a selected memory cell, to generate internal read data.

DQ buffers BF0 to BF127 each include output buffers OBF and input buffers IBF shown in FIG. 25. In data writing, a DQ buffer BFi generates internal write data when receiving write data D<i>, and in data reading, generates output data Q<i>.

I/O switches IOS0 to IOS31 for switching the number of data input/output bits are provided between these preamplifiers/write drivers PW0 to PW127 and DQ buffers BF0 to BF127. Each of these I/O switches IOS0 to IOS31 is arranged corresponding to four adjacent internal data input/output lines I/Os. The number of input/output data bits is switched by switching the internal connection paths in each of I/O switches IOS0 to IOS31.

In a configuration of the data path shown in FIG. 30, the maximum number of data input/output bits is 128 bits. Three types of word configurations, that is, input/output of 128-bit data, input/output of 64-bit data, and input/output of 32-bit data, are implemented by switching the connection paths in a similar manner in I/O switches IOS0 to IOS31.

In an arrangement shown in FIG. 30, I/O switches IOS0 to IOS31 are arranged between multiplexers MUX0 to MUX63 for redundancy replacement shown in FIG. 25 and read data latches RLH0 to RLH63, as well as between internal write data latches WLH0 to WLH63 and write drivers WV0 to WV63. In FIG. 30, however, these multiplexers for repairing a defect and latch circuits for internal data transfer are not shown for the sake of simplicity.

An I/O switch IOS is arranged for adjacent internal data lines I/O, and in each of I/O switches IOS0 to IOS31, connection of a preamplifier/write driver PW to a DQ buffer DF is switched. Thus, the word configuration is switched between 128-bit data, 64-bit data and 32-bit data.

Here, the internal data line I/O includes an internal write data line IL and an internal read data line OL. The internal data lines are arranged into a separated IO configuration, and write data and read data are transferred via separately provided data lines.

FIG. 31 shows more specifically a configuration of I/O switches IOS0 to IOS31 shown in FIG. 30. In FIG. 31, as these I/O switches IOS0 to IOS31 have the same configuration, one IO switch IOSn is shown as a representative.

I/O switch IOSn is arranged between DQ buffers BF4$n$ to BF4$n$+3 and preamplifiers/write drivers PW4$n$ to PW4$n$+3. A multiplexer for redundancy replacement is arranged between I/O switch IOSn and preamplifiers/write drivers PW4$n$ to PW4$n$+3 (with regard to a read path).

Preamplifier/write driver PW4$n$ includes a write driver WV4$n$ and a preamplifier PA4$n$. Write drivers WV4$n$+1 to WV4$n$+3 and preamplifiers PA4$n$+1 to PA4$n$+3 are arranged also in other preamplifiers/write drivers PW4$n$+1 to PW4$n$+3.

DQ buffers BF4$n$ to BF4$n$+3 include input buffers IBF4$n$ to IBF4$n$+3 and output buffers OBF4$n$ to OBF4$n$+3 respectively.

I/O switch IOSn includes metal switches MSWW0 and MSWR0 arranged for a preamplifier/write driver PW4$n$+1, metal switches MSWW1 and MSWR1 provided for a preamplifier/write driver PW4$n$+3, a switch gate ESWW0 rendered conductive when a test mode instruction signal ZMTEST is activated and connecting metal switch MSWW0 to an internal write data line IL4$n$+1, a switch gate ESWR0 rendered conductive when test mode instruction signal ZMTEST is activated and connecting metal switch MSWR0 to an internal read data line OL4$n$+1, a switch gate ESWW1 rendered conductive when test mode instruction signal ZMTEST is activated and coupling metal switch MSWW1 to a metal switch MSWW2, a switch gate ESWR2 rendered conductive when test mode instruction signal ZMTEST is activated and connecting an internal read data line OL4$n$+2 to a metal switch gate MSWR2, a switch gate ESWW2 rendered conductive when test mode instruction signal ZMTEST is activated and connecting an internal write data line IL4$n$+1 to metal switch MSWR2, and a switch gate ESWR1 rendered conductive when test mode instruction signal ZMTEST is activated and coupling metal switch MSWR1 to an internal read data line OL4$n$+3 when conductive.

Test mode instruction signal ZMTEST is an inverted signal of a test mode instruction signal MTEST supplied to select circuit 517 shown in FIG. 17, and is set to L level (an active state) in the test operation mode.

Metal switch MSWW2 couples switch gates ESWW2 and ESWW1 to an internal write data line IL4$n$ when conductive. Metal switch MSWR0 couples switch gate ESWR2 and metal switch MSWR1 to an internal read data line OL4$n$ when conductive.

DQ buffers BF4$n$ to BF4$n$+3 are set to enable/disable state respectively by 4-bit DQ select signal DQSEL<3:0> having respective logic levels set by a metal interconnection.

On the other hand, preamplifiers/write drivers PW4$n$ to PW4$n$+3 are selectively activated in accordance with DQ select signal DQSEL<3:0> and 4-bit IO select signal IOSEL<3:0> generated based on not-shown column address signal CA<5:4>.

Respective connection paths of metal switches MSWW0 to MSWW2 and MSWR0 to MSWR2 are set through the metal interconnection in a slice process. Switch gates ESWW0 to ESWW2 and ESWR0 to ESWR2 are rendered non-conductive when test mode instruction signal ZMTEST is activated in the test mode. In the normal operation mode, test mode instruction signal ZMTEST is inactive, and these switch gates ESWW0 to ESWW2 and ESWR0 to ESWR2 maintain a conductive state.

Therefore, in the test operation mode, preamplifiers/write drivers PW4$n$ to PW4$n$+3 are coupled to corresponding DQ buffers BF4$n$ to BF4$n$+3 respectively, irrespective of the connection path of a metal switch MSW (collectively representing metal switches). In the normal operation mode, the data line is connected in accordance with the connection path of metal switch MSW.

FIG. 32 schematically shows a connection state of I/O switch IOSn in a 128 I/O mode (a full I/O mode). In the 128 I/O mode, metal switches MSWW0 to MSWW2 and MSWR0 to MSWR2 are all set to a non-conductive state. In that state, preamplifiers/write drivers PW4$n$ to PW4$n$+3 are coupled to corresponding DQ buffers BF4$n$ to BF4$n$+3 via internal data lines IOL4$n$ to IOL4$n$+3.

In the full I/O mode, DQ buffers BF4$n$ to BF4$n$+3 are all set to an operable state in accordance with DQ select signals DQSEL<3:0>, and IO select signals IOSEL<3:0> are also all set to a selected state. Therefore, as all preamplifiers/write drivers PW4$n$ to PW4$n$+3 operate, and DQ buffers BF4$n$ to BF4$n$+3 also operate, 4-bit data is transferred via I/O switch IOSn. Therefore, a total of 128-bit data is transferred by I/O switches IOS0 to IOS31.

FIG. 33 schematically shows a connection of the internal data line in a 64 I/O mode (a half I/O mode). In the 64 I/O mode, metal switches MSWW2 and MSWR2 are set to a non-conductive state, and remaining metal switches MSWW0, MSWW1, MSWR0 and MSWR2 are set to a conductive state. In that state, internal data line IOL4$n$+1 is coupled to internal data line IOL4$n$, and internal data line IOL4$n$+3 is coupled to internal data line IOL4$n$+2.

DQ buffers BF4$n$+1 and BF4$n$+3 are set to a non-operable state by DQ select signals DQSEL<3:0>. A set of preamplifiers/write drivers PW4$n$ and PW4$n$+2 or PW4$n$+1 and PW4$n$+3 is activated in accordance with IO select signals IOSEL<3:0>. Therefore, since 2-bit data is transferred in one I/O switch IOSn, a total of 64-bit data transfer is performed.

FIG. 34 schematically shows a connection path of I/O switch IOSn in a 32 I/O mode (a quarter I/O mode). In the 32 I/O mode, metal switches MSWW0 to MSWW2 and MSWR0 to MSWR2 are all set to a conductive state. Therefore, preamplifiers/write drivers PW4$n$+1 to PW4$n$+3 are all coupled to internal data line IOL4$n$.

DQ buffers BF4$n$+1 to BF4$n$+3 are set to a non-operable state in accordance with DQ select signals DQSEL<3:0>, and DQ buffer BF4$n$ is set to an operable state. In addition, one of preamplifiers/write drivers PW4$n$ to PW4$n$+3 is activated in accordance with IO select signals IOSEL<3:0>. Therefore, in I/O switch IOSn, 1-bit data is transferred, and a total of 32-bit data transfer is performed.

In the test operation mode, switch gates ESWW0 to ESWW2 and ESWR0 to ESWR2 are all set to a non-conductive state in accordance with test mode instruction signal ZMTEST. Therefore, a state in which these metal switches MSWW0 to MSWW2 and MSWR0 to MSWR2 are set to a non-conductive state is equivalently implemented, irrespective of conductive/non-conductive states of metal switches MSWW0 to MSWW2 and MSWR0 to MSWR2. Internal data lines IOL4$n$ to IOL4$n$+3 are isolated from each other.

In addition, IO select signals IOL<3:0> and DQ select signals DQSEL<3:0> are all activated in the data write/read operation in the test mode of operation. Therefore, in the test mode, the full I/O mode is implemented irrespective of its practical word configuration, and accordingly, 128-bit data transfer is carried out between the DRAM core and the test interface circuit (TIC). Thus, the time for the test is shortened by performing 128-bit data transfer in the test operation mode even for the DRAM core having a smaller number of input/output data bits (the number of I/Os).

When a DRAM core with a data path the number of input/output data bits (the number of I/Os) made varied in a metal slice process is tested solely, all data bit transfer paths are activated in accordance with test mode instruction signal ZMTEST.

Normally, an operation margin of the DRAM core is tested via the aforementioned test interface circuit (TIC), not via the user logic (logic). This is because, when the DRAM core is tested via the user logic (logic), access patterns for the DRAM core are restricted, and sufficient screening is not achieved. For example, when the logic (user logic) is constituted with a processor with a primary cache embedded, the DRAM core is not accessed if the primary cache is hit. Therefore, access load cannot continuously be applied to the DRAM core.

When the single DRAM core is tested solely via the test interface circuit, the test is simply performed with the data path set to the maximum data bit number of the DRAM core. Therefore, when the single DRAM core with a word configuration variable is tested, the test is carried out under the configuration different from the configuration in the actual use. Accordingly, whether the I/O switch is operating normally or not cannot be tested. In addition, because the configuration of the data path is different from that in the actual use, it is not possible to accurately test whether or not the DRAM core has a sufficient operation margin, even when the operation margin is tested.

Therefore, when shipped in a wafer state and the whole of a product including the logic is tested at a delivered side or a user, an I/O switch failure or an operation margin failure may occur, to lower the yield.

Moreover, when the DRAM core is tested via the user logic (logic) in order to ensure such an operation margin, sufficient screening cannot be performed due to the restriction of the test patterns and others. Therefore, if a final product incorporates this system LSI, system malfunction might be caused, to lower the yield of the final product.

If the yield is decreased, the cost for the product will be higher, and the cost/performance will be lower.

In addition, the word configuration of the DRAM core, even if it can be varied, is set in a fixed manner through the metal interconnection in the slice process. Therefore, when a system including logics having different word configurations is constructed, the DRAM core should be arranged for each logic, and the word configuration thereof should be adapted to the corresponding logic. According to such a system configuration, a plurality of DRAM cores are necessary in accordance with the word configurations, and the system LSI should be constructed for each logic. It is therefore, difficult to integrate logics having different word configurations on one system LSI, and the system size will increase. Further, in order to share data among logics, it is necessary to arrange a common buffer memory outside the system LSI, which will increase the system size.

SUMMARY OF THE INVENTION

An object of the present invention is to provide a semiconductor integrated circuit device capable of effecting sufficient screening on a single DRAM core solely.

Another object of the present invention is to provide a semiconductor integrated circuit device capable of testing a single DRAM core having a word configuration variable under the same condition as in an actual use.

Yet another object of the present invention is to provide a semiconductor integrated circuit device having a DRAM core, of which word configuration can be easily varied in an actual use.

A semiconductor integrated circuit device according to the present invention includes a plurality of internal data lines; a plurality of internal write/read circuits arranged corresponding to the plurality of internal data lines, and each activated in response to a select signal to communicate data with a corresponding internal data line when activated; and a plurality of data input/output circuits arranged corresponding to the plurality of internal write/read circuits, each selectively made operable in accordance with data bit number designating information, activated in response to a data access instruction signal when made operable, and communicating data with a corresponding internal write/read circuit when activated. The data bit number designating information can externally be varied.

The semiconductor integrated circuit device according to the present invention further includes a connection circuit connecting the plurality of internal write/read circuits to the plurality of data input/output circuits, and a path setting circuit setting a connection path in the connection circuit in accordance with the data bit number designating information. The connection circuit includes a switching circuit for electrically setting a connection path between the internal read/write circuit and the data input/output circuit in accordance with the data bit number designating information.

The connection path setting the connection path between the internal write/read circuit and the data input/output circuit can electrically be varied. Thus, the data path can be operated under an actual use condition in a test, and a function of an I/O switch and an operation margin can be tested.

In addition, by testing the single DRAM core solely via the test interface circuit, the DRAM core can directly be tested from the outside using a variety of test patterns, and accurate screening can be carried out. Thus, the yield is improved.

Further, data for setting the connection path can be made accessible from the logic by arranging a circuit for storing the data within the DRAM core. Accordingly, in one system LSI, when a plurality of processors make an access to the DRAM core, each processor can individually set a word configuration for the access, even-if each processor has a different word configuration. Thus, the system will be readily configured, and the system size can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 18 shows signals/data with respect to the DRAM core shown in FIG. 17.

FIG. 19 shows signals/data with respect to the test interface circuit shown in FIG. 17.

FIG. 20 shows a correspondence between signals of the test interface circuit and the DRAM core shown in FIG. 17.

DESCRIPTION OF THE PREFERRED EMBODIMENTS

[First Embodiment]

Figure 1:
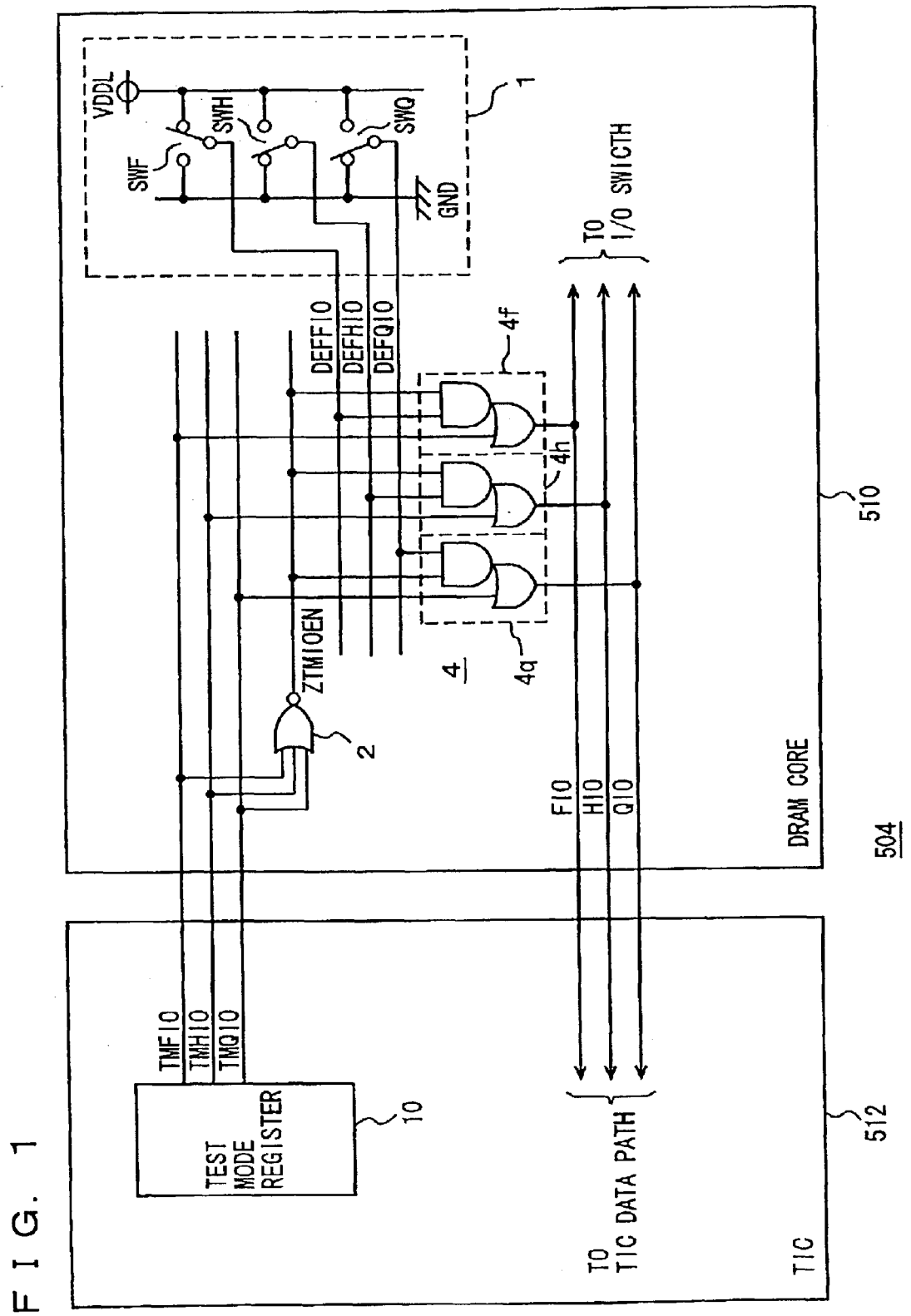
FIG. 1 schematically shows a configuration of a main portion of a DRAM macro according to a first embodiment of the present invention.

FIG. 1 schematically shows a configuration of a main portion of a DRAM macro 504 according to the first embodiment of the present invention. DRAM macro 504 includes a DRAM core 510 and a test interface circuit (TIC) 512. A word configuration of DRAM core 510 can be varied by metal slice. In other words, a connection path of an I/O switch can be set by metal interconnection in a slice process.

The word configuration of DRAM core 510 according to the first embodiment of the present invention can externally be varied via test interface circuit 512 in a test operation mode.

Test interface circuit 512 includes a test mode register 10 storing information for setting the word configuration of DRAM core 510 in the test operation mode. Test mode data bit number designating signals TMFIO, TMHIO and TMQIO are output from test mode register 10, and supplied to DRAM core 510.

Test mode data bit number designating signal TMFIO instructs a full IO mode of using all data bits (I/O lines) of DRAM core 510, and performs 128-bit data transfer, for example. Test mode data bit number designating signal TMHIO instructs a half IO mode of using half of the maximum number of data bits (I/O lines) of DRAM core 510, and designates 64-bit word configuration, for example. Test mode data bit number designating signal TMQIO designates a quarter IO mode of using quarter of the maximum number of data bits of DRAM core 510, and designates a mode in which 32-bit data transfer is performed, for example.

In the test mode, any of these test mode data bit number designating signals TMFIO, TMHIO and TMQIO is set to an active state (H level), and remaining test data bit number designating signals are set to an inactive state (L level).

DRAM core 510 includes a metal word configuration setting circuit 1 for setting the word configuration of the DRAM core by the metal slice, an NOR gate 2 receiving test mode data bit number designating signals TMFIO, TMHIO and TMQIO from test mode register 10, and a modifying circuit 4 selecting either of test mode data bit number designating signals TMFIO, TMHIO and TMQIO from test mode register 10 and fixed data bit number designating signals DEFIO, DEFHIO and DEFQIO from metal word configuration setting circuit 1 in accordance with a test mode IO enable signal TMIOEN output by NOR gate 2, to generate data bit number designating signals FIO, HIO and QIO.

Metal word configuration setting circuit 1 includes metal switches SWF, SWH and SWQ provided corresponding to the full IO mode, the half IO mode, and the quarter IO mode, respectively. These metal switches SWF, SWH and SWQ are each connected to one of a power supply VDDL and a ground GND through metal interconnection, and generate an IO mode designating signal in accordance with a connected power source. FIG. 1 shows, as an example, a state in which metal switch SWF is connected to power supply VDDL, the other metal switches SWH and SWQ are connected to ground GND, and the full I/O mode is designated.

Modifying circuit 4 includes a composite gate 4f generating a full IO designating signal FIO, a composite gate 4h generating a half IO designating signal HIO, and a composite gate 4q generating a quarter IO designating signal QIO. Each of these composite gates 4f, 4h and 4q is constituted with an AND gate and an OR gate equivalently.

These composite gates 4f, 4h and 4q neglect the signals DEFFIO, DEFHIO, DEFQIO generated by metal word configuration setting circuit 1 when a test mode IO enable signal ZTMIOEN from NOR gate 2 is active (at L level), and generate IO designating signals FIO, HIO and QIO in accordance with test mode data bit number designating signals TMFIO, TMHIO and TMQIO applied from test mode register 10.

The full IO designating signal FIO designates the full I/O mode when activated. The half IO designating signal HIO designates the half I/O mode when activated. The quarter IO designating signal QIO designates the quarter I/O mode when activated.

When test mode IO enable signal ZTMIOEN is inactive and at H level, test mode data bit number designating signals TMFIO, TMHIO and TMQIO from test mode register IO are all set to L level. Modifying circuit 4 generates data bit number designating signals FIO, HIO and QIO in accordance with fixed data bit number designating signals DEFFIO, DEFHIO, DEFQIO from metal word configuration setting circuit 1.

In DRAM core 510, data bit number designating signals FIO, HIO and QIO are applied to the I/O switches provided between internal preamplifiers/write drivers and DQ buffers, and are used for setting a connection of the internal data lines. In addition, in test interface circuit 512, data bit number designating signals FIO, HIO and QIO are applied to a TIC data path, and are used for generating a compressed data in accordance with the word configuration (in a multi-bit test mode).

As shown in FIG. 1, by providing modifying circuit 4, test mode data bit number designating signals TMFIO, TMHIO and TMQIO set in test mode register IO can be employed to set logic levels of data bit number (the number of I/Os) designating signals FIO, HIO and QIO setting the word configuration (the number of IOs) of DRAM core 510. Thus, even if metal word configuration setting circuit 1 is set to any of the full IO mode, the half 10 mode and the quarter IO mode by the metal interconnection in the slice process, DRAM core 510 can operate with a word configuration different from that set fixedly by metal word configuration setting circuit 1. Moreover, in the test interface circuit, a multi-bit test can be performed in each I/O mode, and the time for a test can be shortened. Specifically, by setting data designating the word configuration in test mode register 10, DRAM core 510 can operate with a desired word configuration (the number of I/Os), irrespective of the word configuration set in metal word configuration setting circuit 1.

Figure 2:
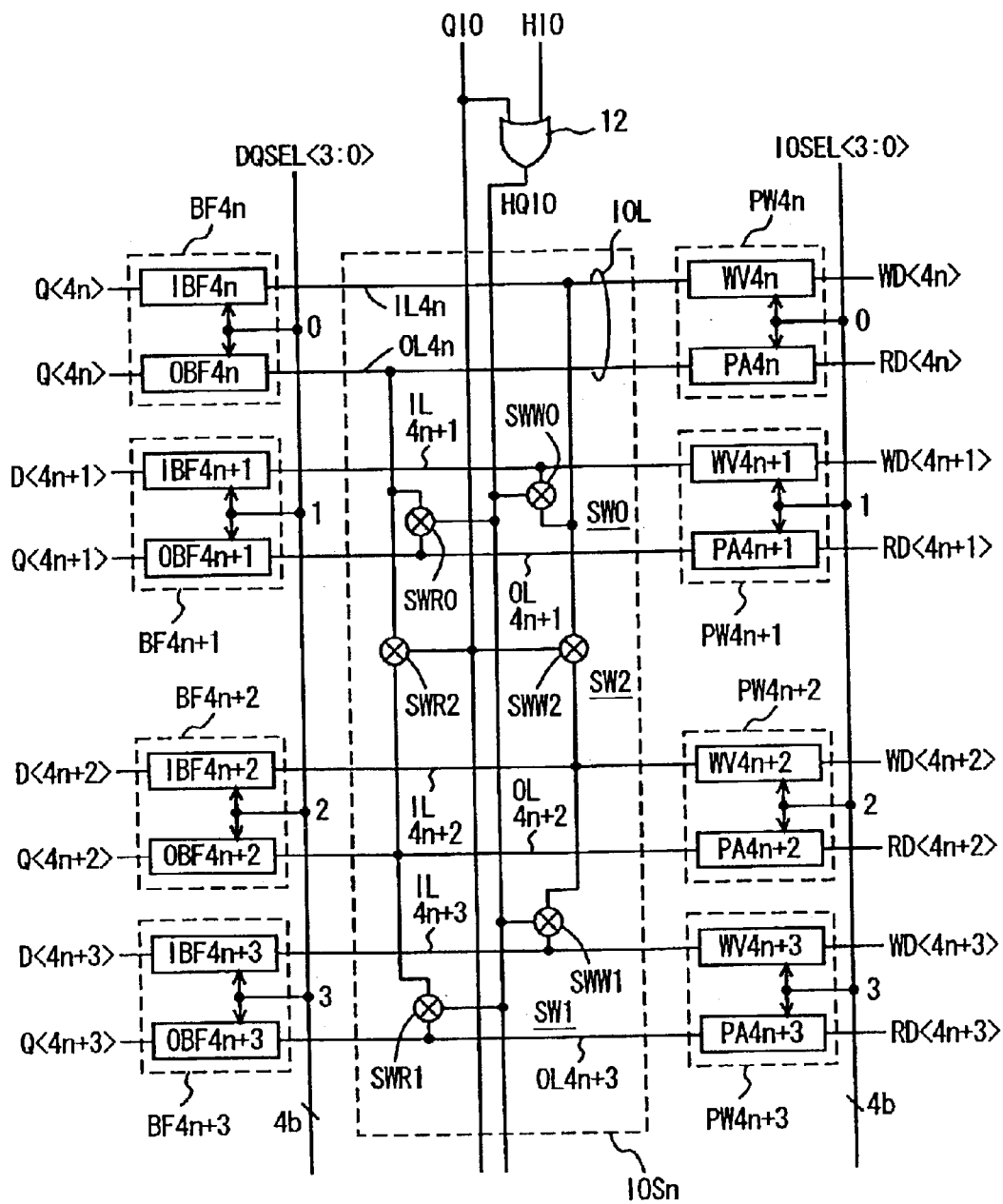
FIG. 2 shows a configuration of an I/O switch according to the first embodiment of the present invention.
Figure 31:
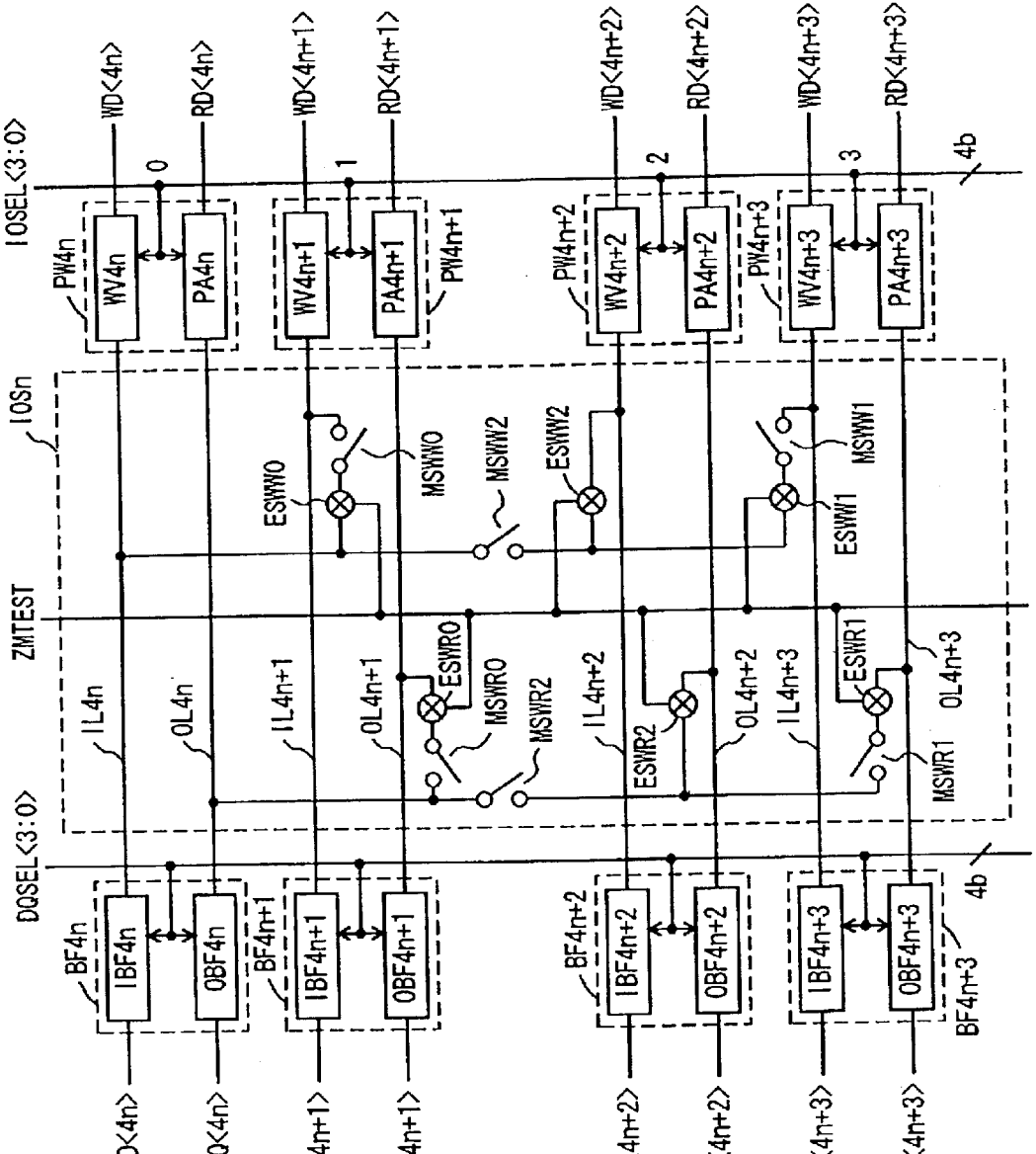
FIG. 31 shows an example of a configuration of an I/O switch shown in FIG. 30.
Figure 32:
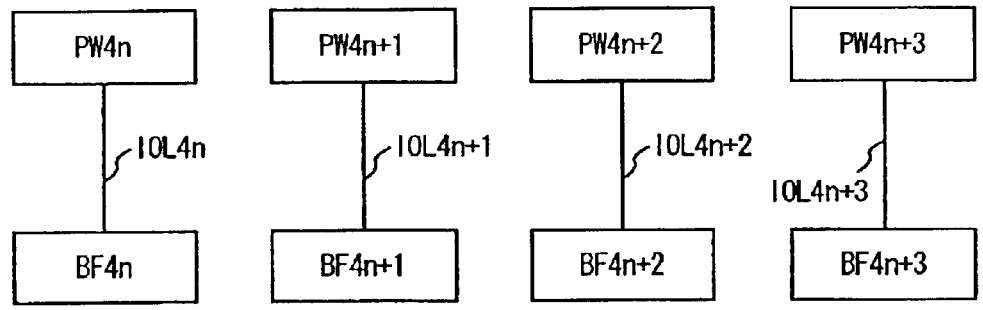
FIG. 32 shows connection in a full I/O mode of the I/O switch shown in FIG. 31.
Figure 33:
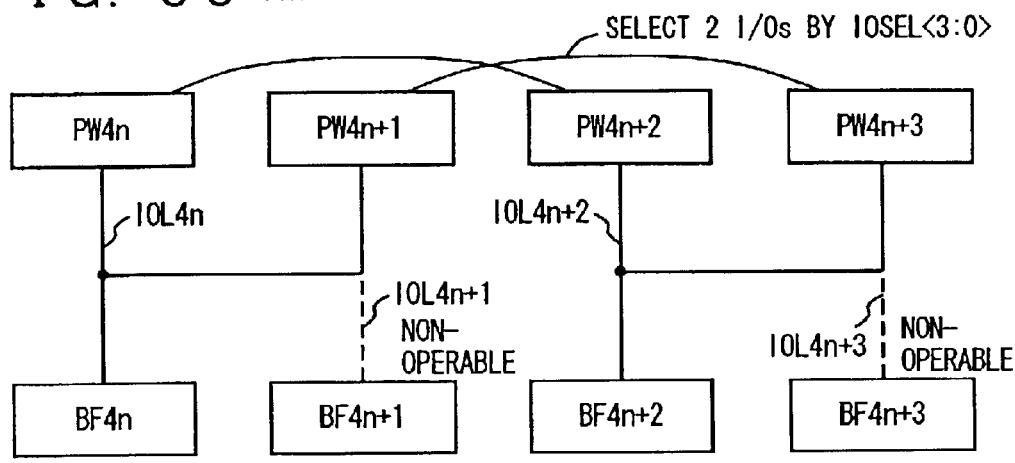
FIG. 33 shows connection in a 64 I/O mode of the I/O switch shown in FIG. 31.
Figure 34:
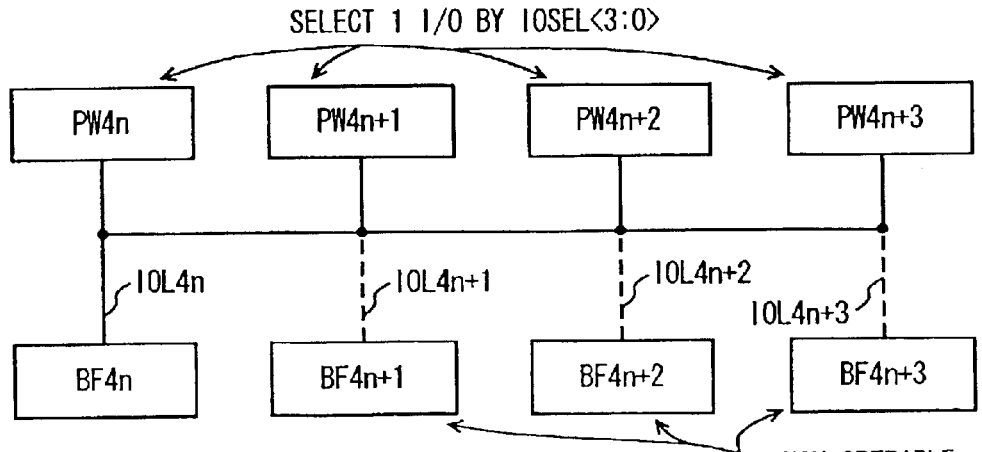
FIG. 34 shows connection in a 32 I/O mode of the I/O switch shown in FIG. 31.

FIG. 2 schematically shows a configuration of an I/O switch of the DRAM core according to the first embodiment of the present invention. FIG. 2 shows an I/O switch IOSn provided for four adjacent internal data lines IOL. Preamplifiers/write drivers PW4n to PW4n+3 and DQ buffers BF4n to BF4n+3 are arranged corresponding to I/O switch IOSn. Since these preamplifiers/write drivers and DQ buffers have the same configurations as those shown in FIG. 31, same reference characters are given to corresponding components, and detailed description thereof will not be repeated.

In order to set the connection path in the I/O switch, an OR gate 12 receiving a half IO designating signal HIO and a quarter IO designating signal is provided. The connection path in I/O switch IOSn is set in accordance with an output signal HQIO of OR gate 12 and a quarter IO designating signal QIO. Output signal HQIO of OR gate 12 and quarter IO designating signal QIO are applied in common to IO switches IOS0 to IOS31.

I/O switch IOSn includes a switch gate SWW0 rendered conductive when output signal (half/quarter IO designating signal) HQIO of OR gate 12 is activated (at H level) and coupling internal write data line IL4n+1 to internal write data line IL4n, a switch gate SWR0 rendered conductive when half/quarter IO designating signal HQIO is activated and coupling internal read data line OL4n+1 to internal read data line OL4n, a switch gate SWW2 rendered conductive when quarter IO designating signal QIO is activated and coupling internal write data line IL4n+2 to internal write data line IL4n, a switch gate SWR2 rendered conductive when quarter IO designating signal QIO is activated and coupling internal read data line OL4n+2 to internal read data line OL4n, a switch gate SWW1 rendered conductive when half/quarter IO designating signal HQIO is activated and coupling internal write data line IL4n+3 to internal write data line IL4n+2, and a switch gate SWR1 rendered conductive when half/quarter IO designating signal HQIO is activated and coupling internal read data line OL4n+3 to internal read data line OL4n+2.

Figure 25:
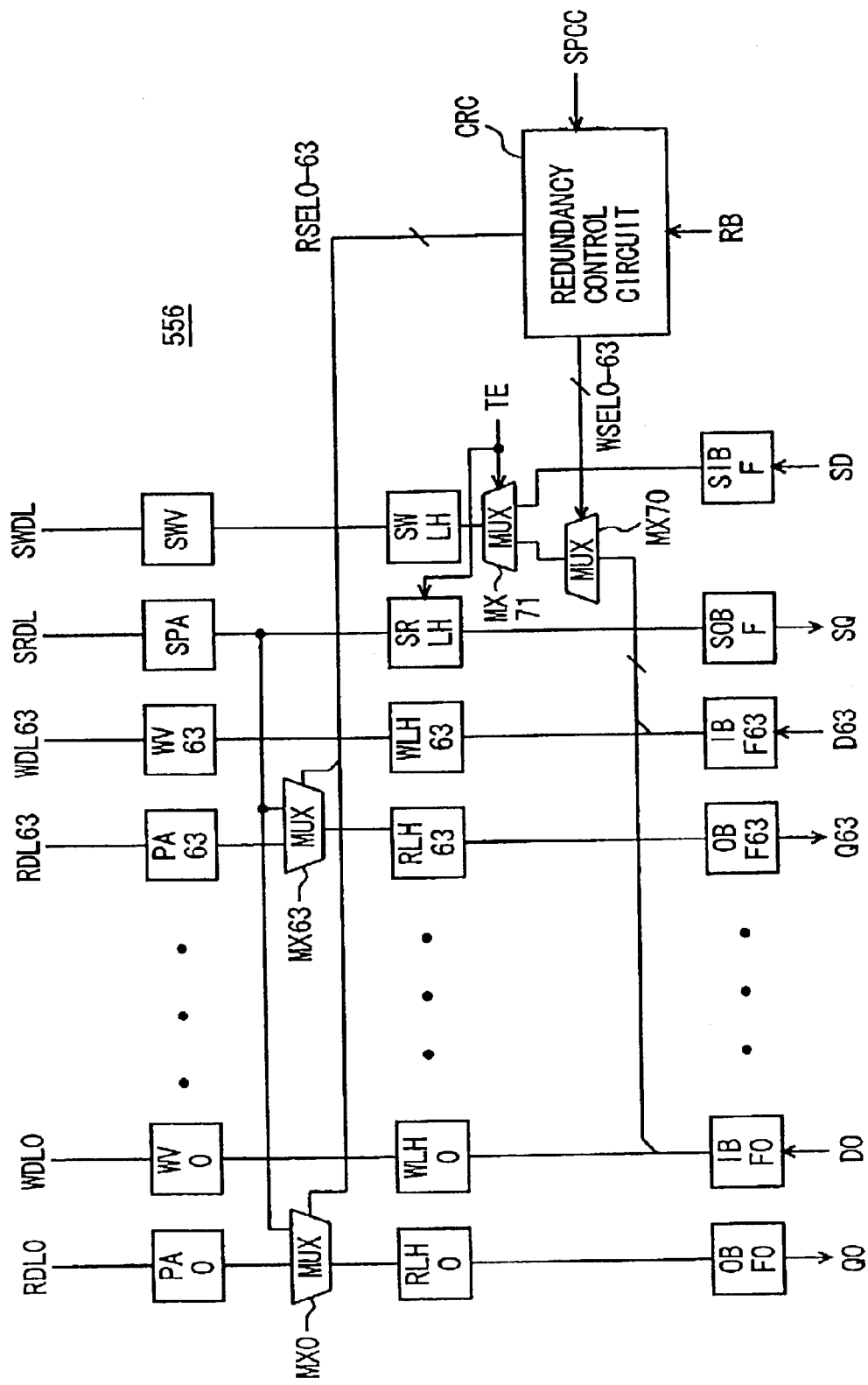
FIG. 25 schematically shows a configuration of a data path shown in FIG. 21.

An internal write data line IL and an internal read data line OL form an internal data line IOL. In I/O switch IOSn, switch gates SWR0 to SWR2 are arranged between the multiplexers for redundancy replacement shown in FIG. 25 and read latch circuits, and switch gates SWW0 to SWW2 are arranged between the write latch circuits and the write drivers as shown in FIG. 25. The configuration for redundancy replacement is not shown for the sake of simplicity. Switch gates SWWi and SWRi form a switch circuit SWi.

These switch gates SWW0 to SWW2 and SWR0 to SWR2 are each set to conductive/non-conductive state in accordance with the applied IO mode designating signal, and electrically set a connection path between an associated preamplifier/write driver PW and an associated DQ buffer BF. These electric switches SWW0 to SWW2 and SWR0 to SWR2 are used to electrically set the connection path, so that switching of the I/O modes can readily be performed. In addition, because the metal switch is not arranged in the I/O switch, the configuration of I/O switch IOS is also simplified.

Figure 3:
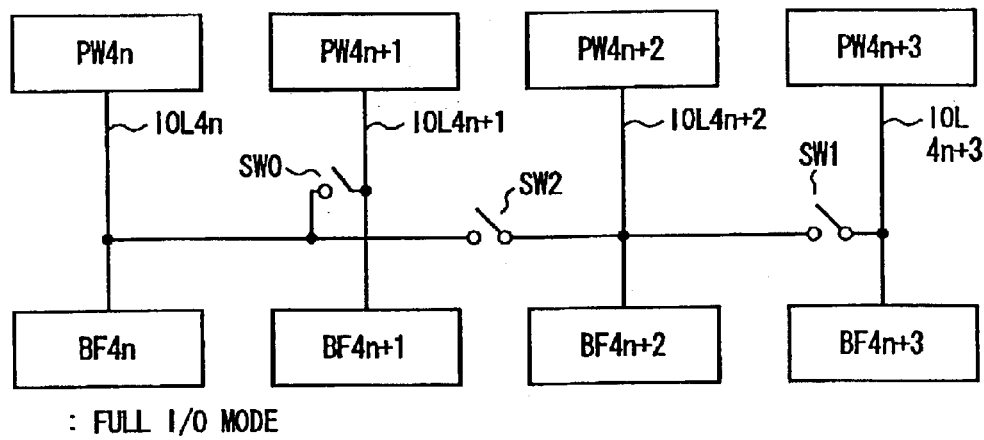
FIG. 3 schematically shows a connection in a full I/O mode of the I/O switch shown in FIG. 2.

FIG. 3 schematically shows a connection of I/O switch IOSn in the full I/O mode. FIG. 3 shows switch gates SWW0 and SWR0 by a switch circuit SW0, switch gates SWW2 and SWR2 by a switch circuit SW2, and switch gates SWW1 and SWR1 by a switch circuit SW1.

In FIG. 3, preamplifiers/write drivers PW4n to PW4n+3 are coupled to DQ buffers BF4n to BF4n+3 via internal data lines IOL4n to IOL4n+3 respectively. In the full I/O mode, half IO designating signal HIO and quarter IO designating signal QIO shown in FIG. 2 are both at L level, and switch circuits SW0 to SW2 are all set to a non-conductive state. Therefore, internal data lines IOL4n to IOL4n+3 are each isolated from others, and 4 bit data is transferred via I/O switch IOSn.

Figure 4:
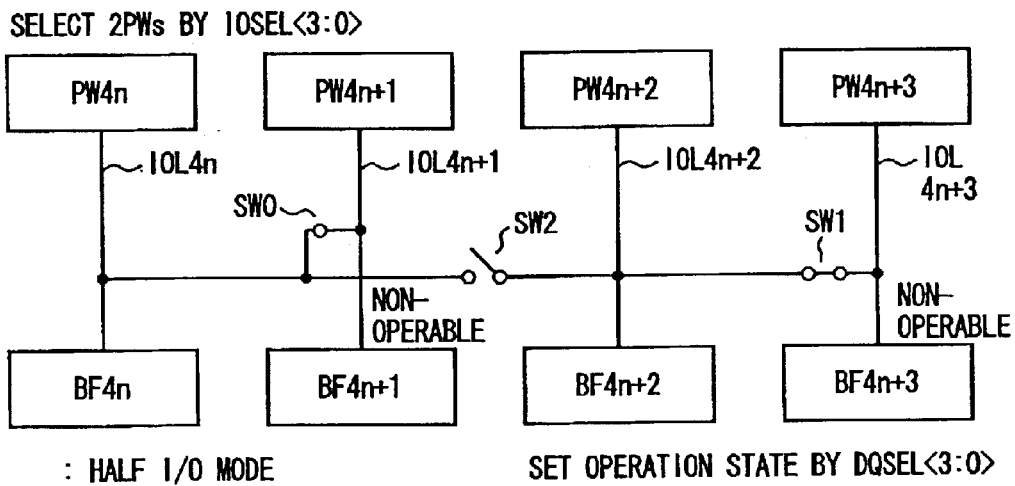
FIG. 4 schematically shows a connection in a half I/O mode of the I/O switch shown in FIG. 2.

FIG. 4 schematically shows a connection in IO switch IOSn in the half I/O mode. In the half I/O mode, half IO designating signal HIO is set to H level, and quarter IO designating signal QIO is set to L level. Therefore, in FIG. 2, half/quarter IO designating signal HQIO output by OR gate 12 is set to H level, and switch circuits SW0 and SW1 are rendered conductive. On the other hand, switch circuit SW2 maintains a nonconductive state because quarter IO designating signal QIO is at L level. Therefore, internal data line IOL4n+1 is connected to internal data line IOL4n, and internal data line IOL4n+3 is connected to internal data line IOL4n+2.

In preamplifiers/write drivers PW4n to PW4n+3, two preamplifiers/write drivers are simultaneously selected in accordance with IO select signals IOSEL<3:0>. On the other hand, with regard to DQ buffers BF4n to BF4n+3, two DQ buffers BF4n and BF4n+2 are set to an operable state, and DQ buffers BF4n+1 and BF4n+3 are set to a non-operable state, in accordance with DQ select signals DQSEL<3:0>.

Therefore, under such condition, 2-bit data is transferred via DQ buffers BF4n and BF4n+2.

Figure 5:
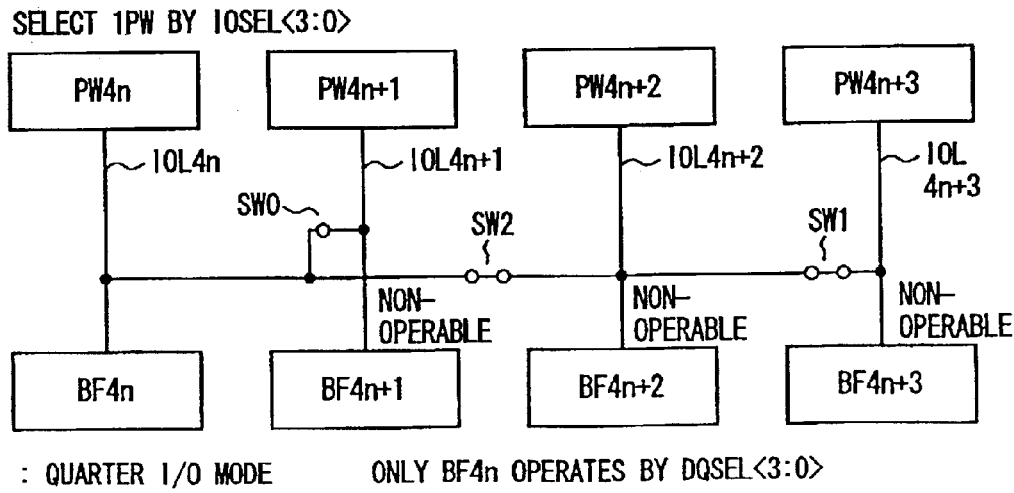
FIG. 5 schematically shows a connection in a quarter I/O mode of the I/O switch shown in FIG. 2.

FIG. 5 schematically shows a connection in the I/O switch in the quarter I/O mode. In the quarter I/O mode, quarter IO designating signal QIO is set to H level, and half IO designating signal HIO is set to L level. In such a state, quarter IO designating signal QIO and half/quarter IO designating signal HQIO are set to H level, and switch circuits SW0 to SW2 are all in a conductive state. Therefore, internal data lines IOL4n+1 to IOL4n+3 are all connected to internal data line IOL4n.

One of four preamplifiers/write drivers PW4n to PW4n+3 is selected by IO select signals IOSEL<3:0>. Moreover, DQ buffer BF4n is set to an operable state by DQ select signals DQSEL<3:0>, and remaining DQ buffers BF4n+1 to BF4n+3 are all set to a non-operable state. Therefore, one of four adjacent internal data lines IOL (IOL4n to IOL4n+3) is selected to transfer 1-bit data.

As shown in FIGS. 3 to 5, switch circuits SW0 (SWW0, SWR0) to SW2 (SWW2, SWR2) are set to a conductive/non-conductive state. Thus, a desired word configuration can be set, irrespective of the word configuration set in metal word configuration setting circuit 1. In addition, it is not necessary to set the full I/O mode in the test mode using a dedicated mode control signal irrespective of the word configuration, and the configuration of the I/O switch is simplified.

Figure 6:
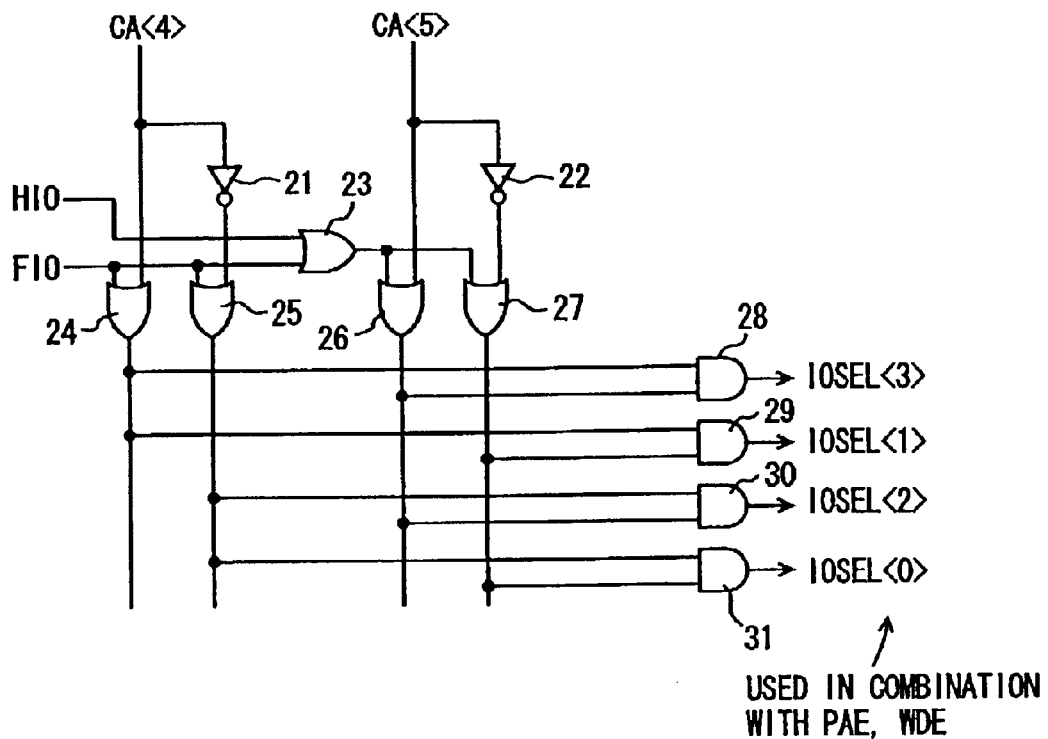
FIG. 6 shows an example of a configuration of a portion for producing an IO select signal shown in FIG. 2.

FIG. 6 shows an example of a configuration of a portion for generating I/O select signals IOSEL<3:0>. In FIG. 6, an IO select signal generating portion includes an inverter 21 inverting a column address bit CA<4>, an inverter 22 inverting a column address bit CA<5>, an OR gate 23 receiving full IO designating signal FIO and half IO designating signal HIO, an OR gate 24 receiving column address bit CA<4> and full IO designating signal FIO, an OR gate 25 receiving an output signal of inverter 21 and full IO designating signal FIO, an OR gate 26 receiving an output signal of OR gate 23 and column address bit CA<5>, and an OR gate 27 receiving an output signal of inverter 22 and the output signal of OR gate 23.

Column address bit CA<4> is set to a degenerated state by OR gates 24 and 25 when the full I/O mode is designated. Column address bit CA<5> is set to a degenerated state by OR gates 23, 26 and 27 when the half IO mode or the full I/O mode is designated. Therefore, when the full I/O mode is designated, column address bits CA<5> and CA<4> are both set to a degenerated state, and a data line select operation is performed in accordance with remaining column address bits CA<3:0>.

When the half I/O mode is designated, column address bit CA<5> is degenerated, and two preamplifiers/write drivers are selected in accordance with column address bit CA<4>. In the quarter I/O mode, column address bits CA<5> and CA<4> are both valid, and one preamplifier/write driver is selected.

The IO select signal generating portion further includes an AND gate 28 receiving output signals of OR gates 24 and 26 to generate IO select signal IOSEL<3>, an AND gate 29 receiving output signals of OR gates 24 and 27 to generate IO select signal IOSEL<1>, an AND gate 30 receiving output signals of OR gates 25 and 26 to generate IO select signal IOSEL<2>, and an AND gate 31 receiving output signals of OR gates 25 and 27 to generate IO select signal IOSEL<0>.

Therefore, in the full I/O mode, IO select signals IOSEL<0> to IOSEL<3> are all driven to a select state. In the half I/O mode, either a set of IO select signals IOSEL<1> and IOSEL<3> or a set of IO select signals IOSEL<0> and IOSEL<2> is driven to a selected state. In the quarter I/O mode, one of IO select signals IOSEL<0> to IOSEL<3> is driven to a select state in accordance with column address bits CA<5:4>.

Therefore, when half IO designating signal HIO and full IO designating signal FIO are applied to the IO select signal generating portion, and column address bits CA<5:4> are selectively set to a degenerated state, the preamplifier/write driver can selectively be activated in accordance with the word configuration.

In data writing/reading, in accordance with a supplied command, a corresponding preamplifier/write driver is activated in accordance with a combination of these IO select signals IOSEL<0> to IOSEL<3> and a preamplifier enable signal PAE or a write driver enable signal WDE.

Figure 7:
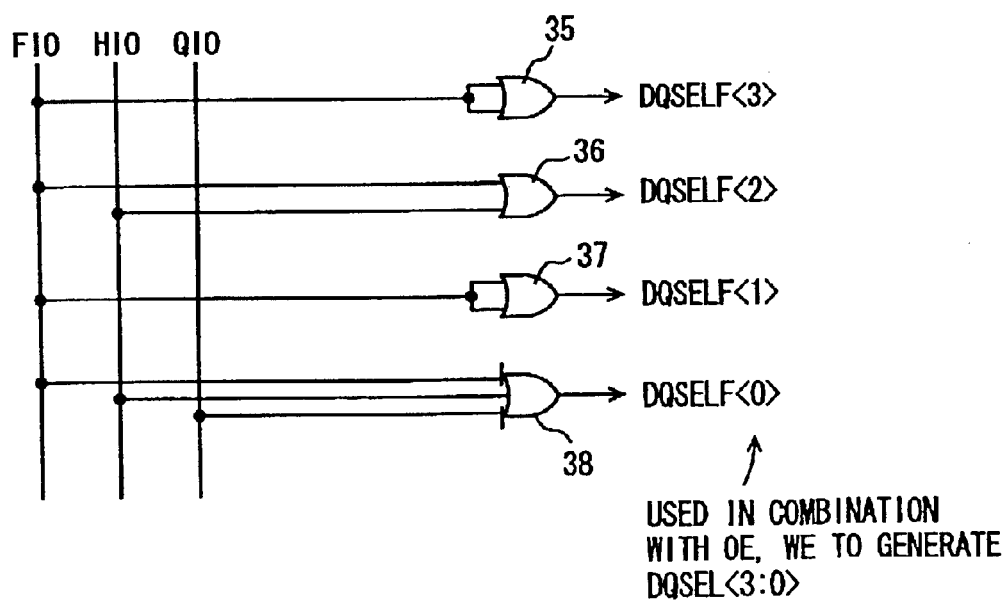
FIG. 7 shows a configuration of a portion for producing a DQ select signal shown in FIG. 2.

FIG. 7 shows an example of a configuration of a portion for generating DQ select signals DQ<3:0>. In FIG. 7, the DQ select signal generating portion includes a buffer circuit 35 buffering the full IO 25 designating signal to generate DQ select fast signal DQSELF<3>, an OR gate 36 receiving full IO designating signal FIO and half IO designating signal HI0 to generate DQ select fast signal DQSELF<2>, a buffer circuit 37 buffering full IO designating signal FIO to generate DQ select fast signal DQSELF<1>, and an OR gate 38 receiving full IO designating signal FIO, 30 half IO designating signal HIO and quarter IO designating signal QIO to generate DQ select fast signal DQSELF<0>. Buffer circuits 35 and 37 are each constituted with an OR gate having two inputs connected in common.

DQ select fast signals DQSELF<3:0> are used in combination with an input activation timing signal or an output activation timing signal generated by an output signal OE and a write enable signal WE, to generate DQ select signals DQSEL<3:0>. In other words, a DQ buffer set to an operable state is operated through an AND operation or an NAND operation of the activation timing signal with the DQ select fast signals, to input/output data.

Output enable signal OE is activated at a prescribed timing when a read activation signal /RE is activated, and write enable signal WE is activated when a write operation instruction signal /WE is activated.

In the configuration shown in FIG. 7, in the full I/O mode, all DQ select fast signals DQSELF<3:0> are set to an active state. In the half I/O mode, DQ select fast signals DQSELF<2> and DQSELF<0> maintain an active state. In the quarter I/O mode, only DQ select fast signal DQSELF<0> maintains an active state. Therefore, the DQ buffer can selectively be set to an operable state in accordance with these IO designating signals FIO, HIO and QIO.

Figure 8:
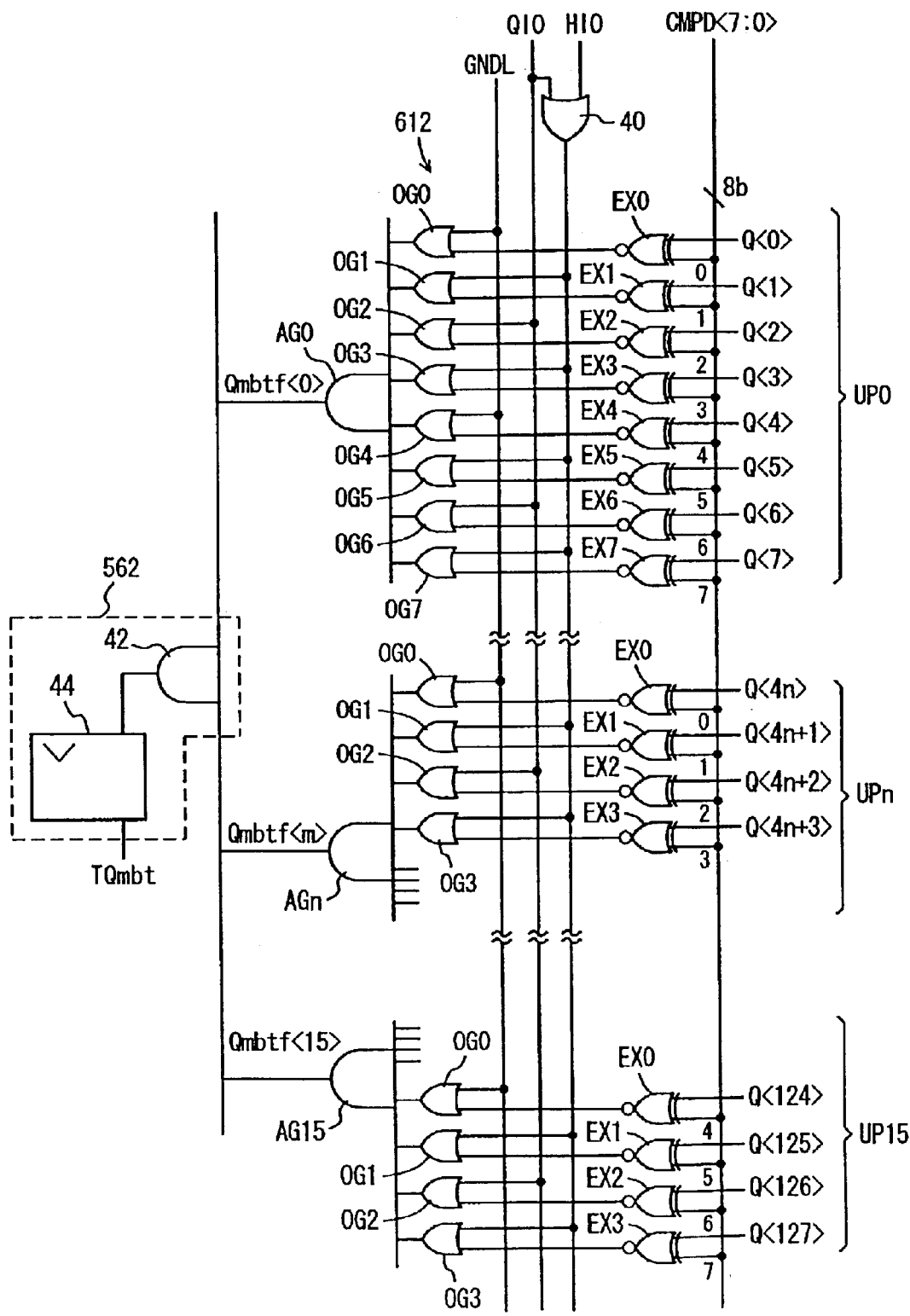
FIG. 8 shows a configuration of a main portion of a data path in a test interface circuit according to the first embodiment of the present invention.

FIG. 8 schematically shows a configuration of a data path and a multi-bit test determining portion in the test interface circuit according to the first embodiment of the present invention. In the TIC data path shown in FIG. 8, a configuration of a portion for generating multi-bit test result indicating signal TQmbt included in TIC control circuit 562 is shown.

In FIG. 8, sixteen unit processing circuits UP are provided, and each of these unit processing circuits UP has the same configuration. FIG. 8 shows a whole configuration of a unit processing circuit UP0 for output data bits Q<7:0>, and a configuration of a part of unit processing circuits UPEn and UP15. Configurations of remaining unit processing circuits are not shown for the sake of simplicity.

Unit processing circuit UP0 includes EXNOR gates EX7 to EX0 receiving expected value data CMPD<7:0> and output data Q<7:0> respectively, OR gates OG0 to OG7 provided corresponding to EXNOR gates EX0 to EX7 respectively, and an AND gate AG0 receiving output signals of OR gates OG0 to OG7 to generate an 8-bit multi-bit test result indicating signal Qmbtf<0> indicating a result of multi-bit test on 8 bits of Q<7:0>.

An OR gate 40 receiving quarter IO designating signal QIO designating the quarter I/O mode and half IO mode designating signal HIO is provided in order that, in the multi-bit test, a determination result for an invalid data bit is set to indicate constantly the matching state to be excluded from a multi-bit determination operation, and a multi-bit determination operation is carried out only for a valid bit. Moreover, a ground line transmitting a ground voltage GNDL is provided in order that a load for a data bit to be a constantly valid data bit in the full I/O mode, the half I/O mode and the quarter I/O mode is set identical to that for another data bit to selectively be an invalid bit.

An OR gate OG0 receives an output signal of EXNOR gate EX0 and ground voltage GNDL, and outputs a valid determination result in each I/O mode. An OR gate OG1 receives an output signal of OR gate 40 and an output signal of EXNOR gate EX1, and outputs a valid determination result in the full I/O mode and a matching state determination result in other I/O modes. Here, the valid determination result represents a determination result corresponding to that output by a corresponding EXNOR gate.

An OR gate OG2 receives an output signal of EXNOR gate EX2 and quarter IO designating signal QIO, and outputs constantly a match determination result in the quarter I/O mode and a valid determination result in other I/O modes. An OR gate OG3 receives the output signal of OR gate 40 and an output signal of EXNOR gate EX3, and outputs a valid determination result in the full I/O mode and a match determination result in other I/O modes.

An OR gate OG4 receives ground voltage GNDL and an output signal of EXNOR gate EX4, and outputs a valid determination result in each I/O mode. An OR gate OG5 receives the output signal of OR gate 40 and an output signal of EXNOR gate EX5, and outputs a valid determination result in the full I/O mode and a match determination result in another I/O mode.

An OR gate OG6 receives quarter IO designating signal QIO and an output signal of EXNOR gate EX6, and outputs a match determination result in the quarter I/O mode and a valid determination result in other I/O modes. An OR gate OG7 receives the output signal of OR gate 40 and an output signal of EXNOR gate EX7, and outputs a valid determination result in the full I/O mode, and constantly a match determination result in other I/O modes.

Output signals Qmbtf<0:15> of respective AND gates AG0 to AG15 of unit processing circuits UP0 to UP15 are applied in parallel to an AND gate 42 included in TIC control circuit 562. A signal indicating a compressed result for 128-bit data is generated by AND gate 42, and is output as multi-bit test result indicating signal TQmbt via a flip-flop 44.

In the full I/O mode, IO designating signals QIO and HIO are at L level. Therefore, OR gates OG0 to OG7 operate as buffer circuits, and supply output signals of corresponding EXNOR gates EX0 to EX7 to corresponding AND gates AGn (n=0 to 15). Therefore, in this case, a multi-bit test on 8-bit data can be performed in each of unit processing circuits UP0 to UP15.

In the half I/O mode, half IO mode designating signal HIO is at H level, and quarter IO mode designating signal QIO is at L level. In the half I/O mode, data Q<4m+1> and Q<4m+3> are invalid, because corresponding DQ buffers do not transfer the data from the DRAM core.

Therefore, when output signals of OR gates OG1, OG3, OG5 and OG7 provided for EXNOR gates EX1 and EX3 as well as EX5 and EX7 are set to H level and set to a state indicating a match, a multi-bit determination can be performed only for valid data bits.

In the quarter I/O mode, data bits Q<4m+1> to Q<4m+3> are not transferred from the DRAM core, and these data transferred to the test interface circuits are invalid. In such a case, the output signal of OR gate 40 and IO designating signal QIO are set to H level, and the multi-bit test is performed only for data bit Q<4i> in the data bits Q<4i+7:4i>. In other words, determination of match/mismatch for 2-bit data is performed respectively in unit processing circuits UP0 to UP15.

Figure 27:
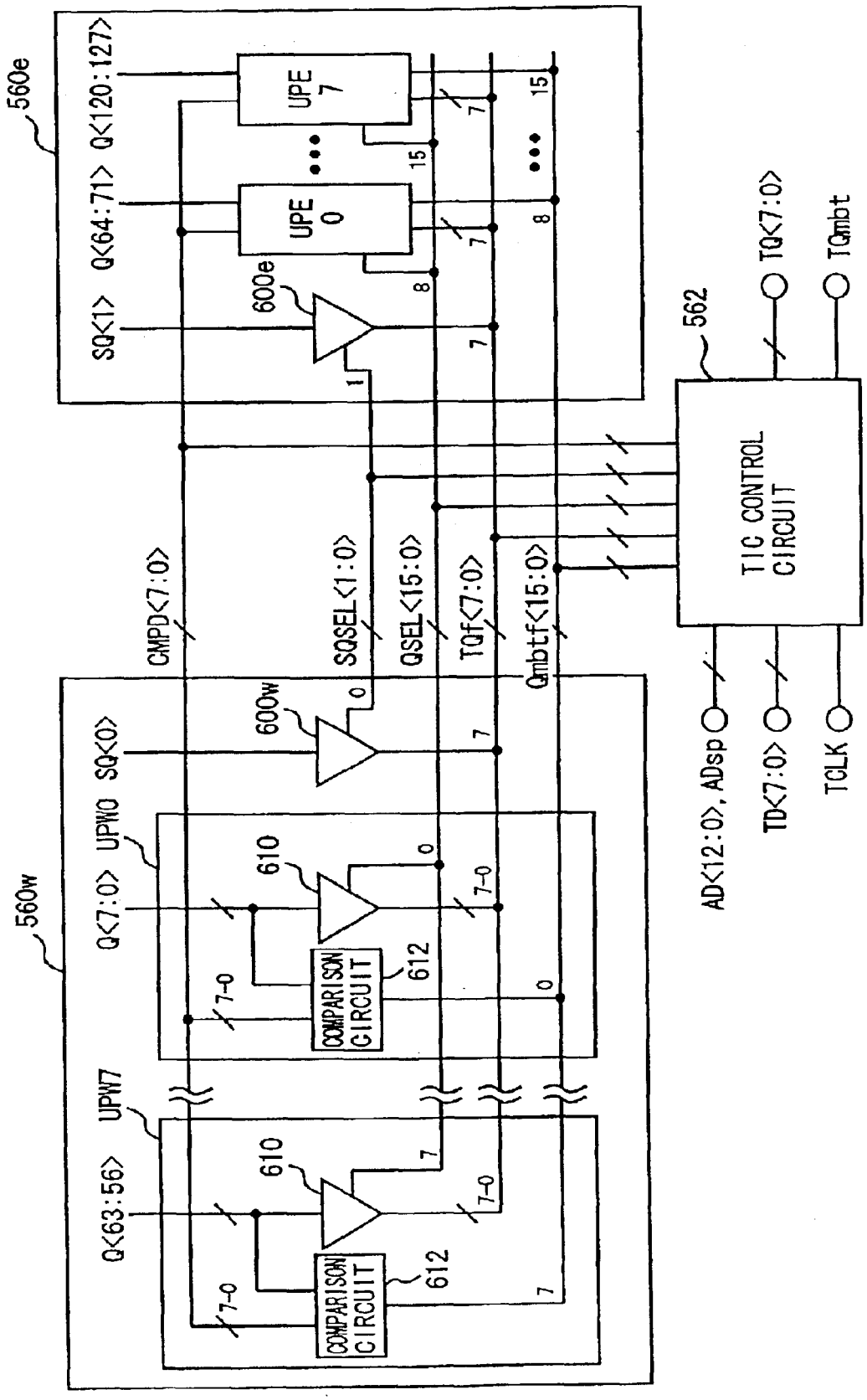
FIG. 27 schematically shows a configuration of a data read portion of the data path of the test interface circuit shown in FIG. 21
Figure 28:
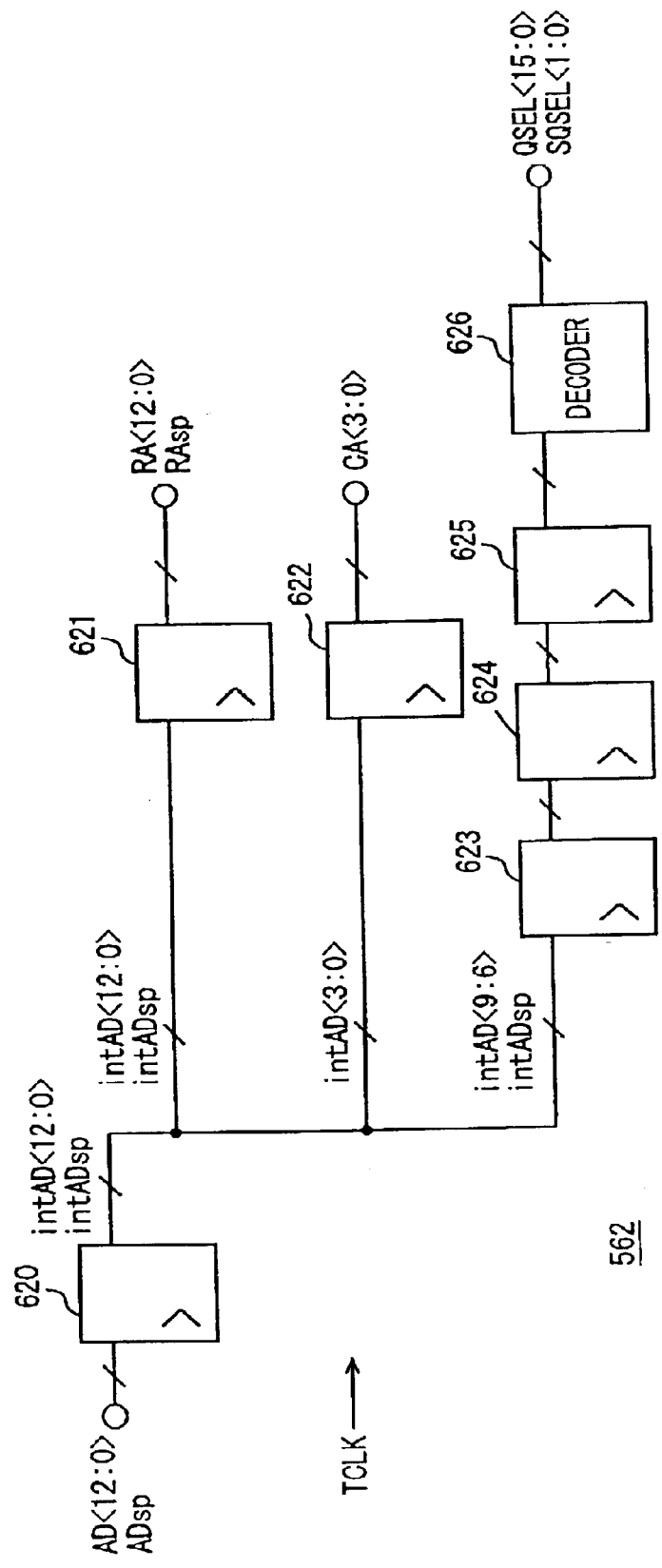
FIG. 28 schematically shows a configuration of a TIC control portion circuit of the test interface circuit shown in FIG. 21.
Figure 29:
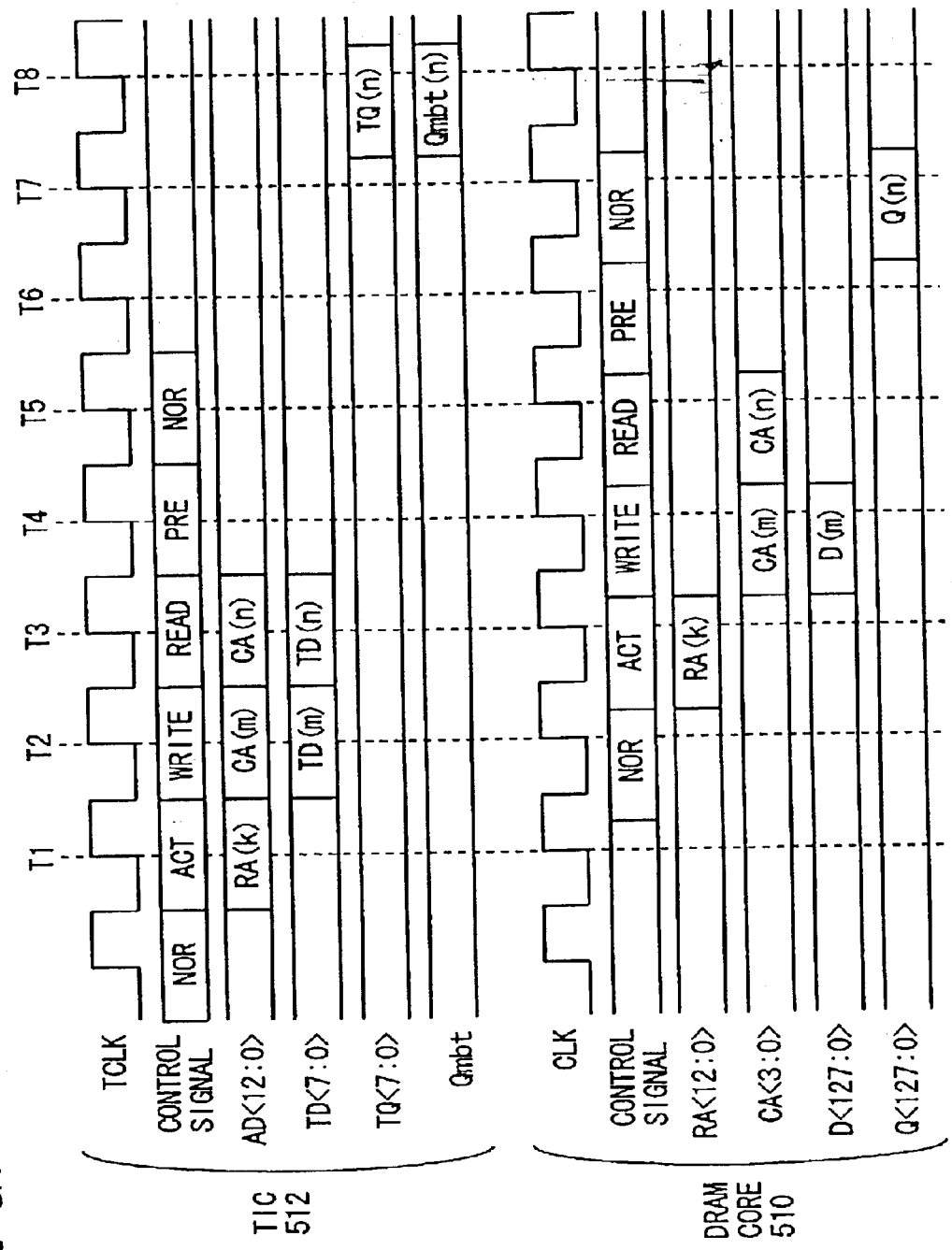
FIG. 29 is a timing diagram representing an operation of the DRAM macro shown in FIG. 21.
Figure 30:
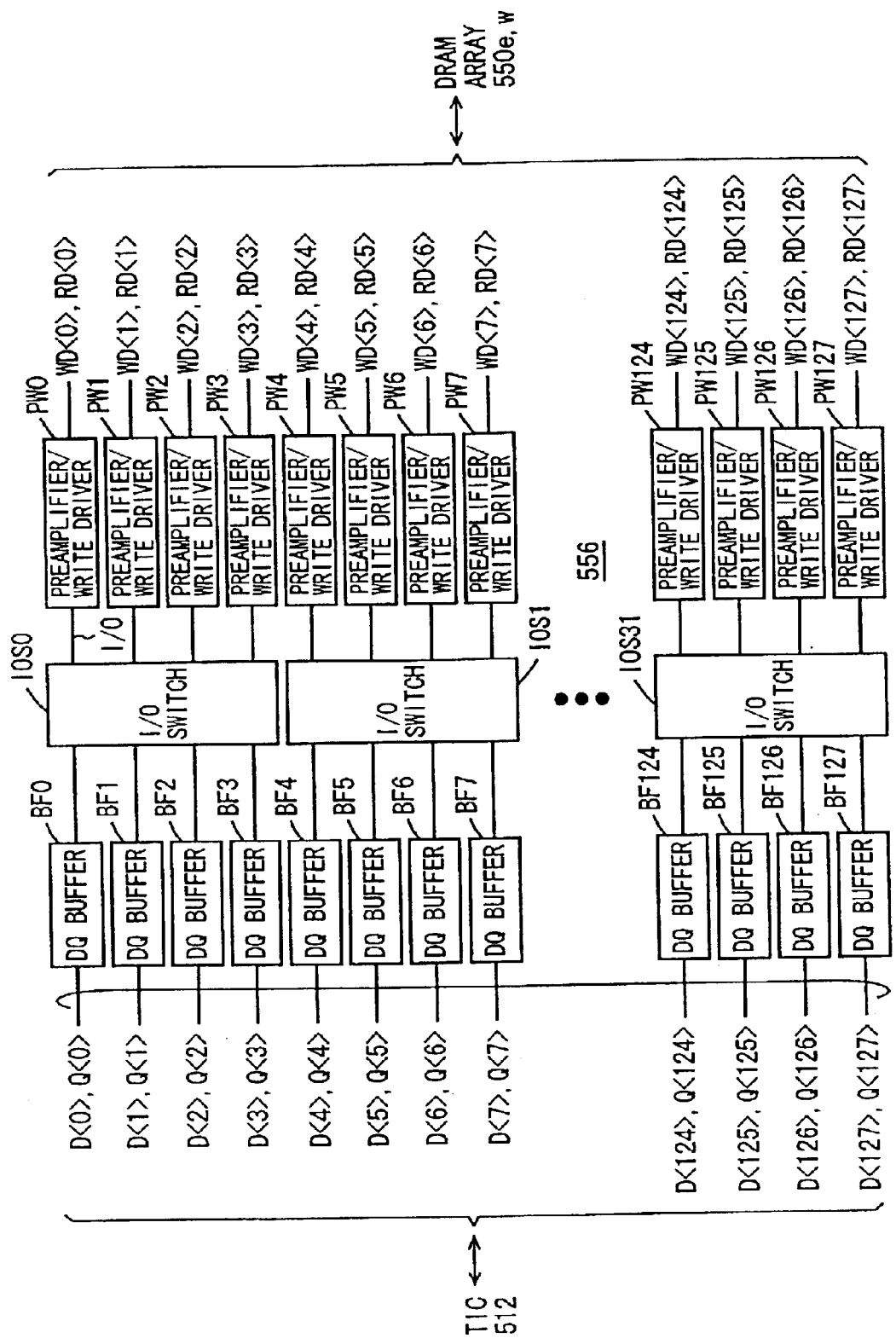
FIG. 30 schematically shows a configuration of a data path of a conventional DRAM core.

Therefore, in the test interface circuit, as shown in FIG. 27, when data is selected in a unit of adjacent 8 bits in accordance with test output data select signals QSEL<15:0> and output externally, in the half I/O mode, valid data are output only to test data bits TQ<6>, TQ<4>, TQ<2> and TQ<0>, and invalid data are output to remaining odd-numbered test data bit terminals.

Figure 26:
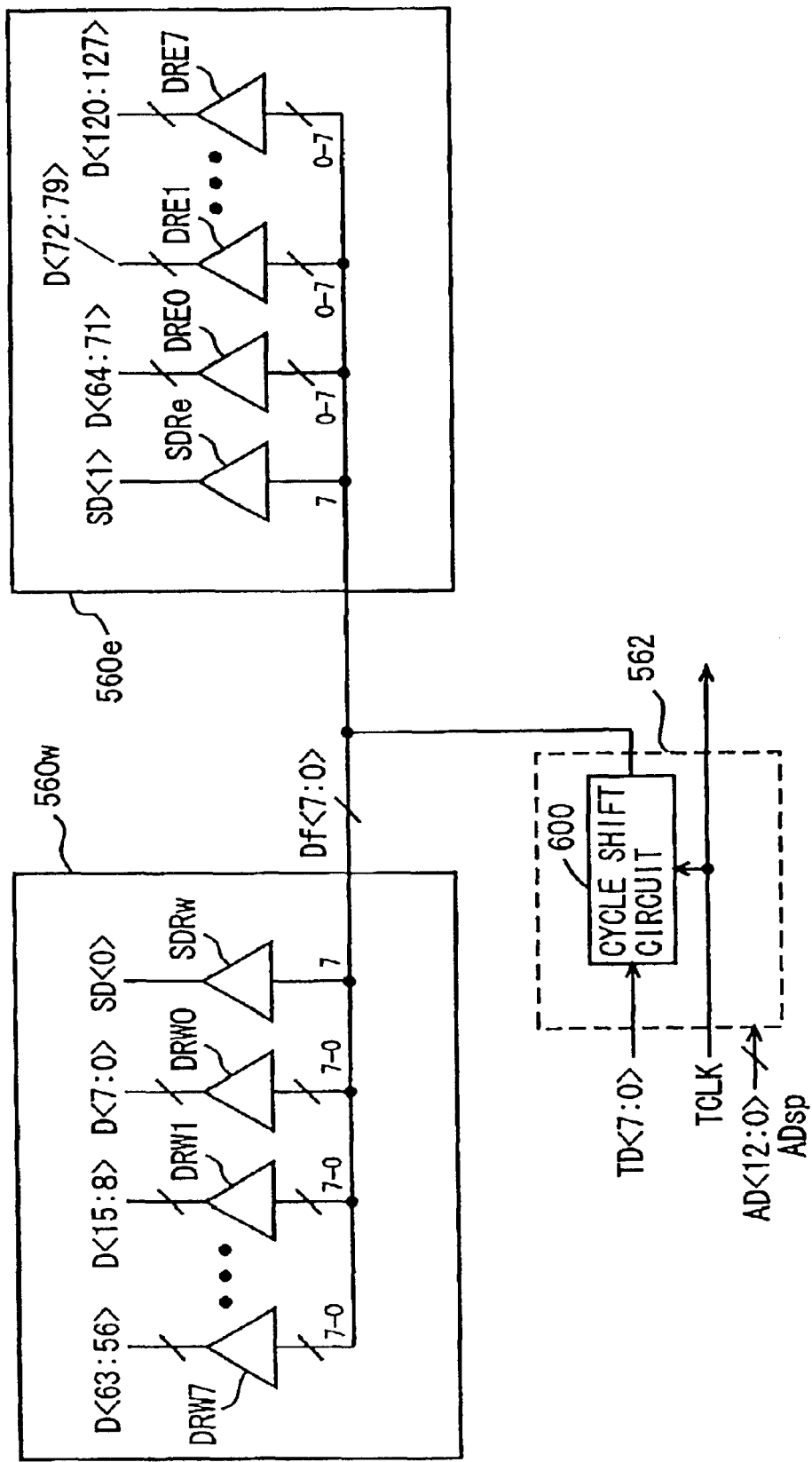
FIG. 26 schematically shows a configuration of a data write portion of the data path of a test interface circuit shown in FIG. 21.

In addition, in the quarter I/O mode, valid data are output only to test data bits TQ<4> and TQ<0>. In writing as well, as shown in FIG. 26, in a configuration in which data having the same pattern as external test data T<7:0> are repetitively generated for each 8 bits in accordance with test data TD<7:0>, only test data TD<4> and TD<0> are valid data to be written in the DRAM core. In the quarter I/O mode in which quarter IO mode designating signal QIO is activated, only test data TD<4> and TD<0> are the valid data to be written in the DRAM core.

Therefore, when the test interface circuit (TIC) is viewed from the tester in the test, in the half I/O mode in which half IO designating signal HIO is activated, the word configuration is of a 4-bit separated read/write type, while in the quarter I/O mode in which quarter IO designating signal QIO is activated, the word configuration is of a 2-bit separated read/write type.

When the number of word bits is reduced viewed from the tester, the time for the test is lengthened. The increase of the time for test, however, is suppressed in the following manner. Most of the tests are performed in the full I/O mode, and only when a switching operation of the IO switches in the data path is tested, the test is performed in the half I/O mode or the quarter I/O mode in accordance with an actual use condition.

Normally, the multi-bit test is performed. Therefore, no problem will be caused even if a test is performed in each I/O mode for the DRAM cores set to the half I/O mode and the quarter I/O mode. Thus, it is possible to accurately test whether or not the I/O switches in the data path normally function in accordance with the word configuration of the DRAM core. In addition, also in the test in the half I/O mode or the quarter I/O mode, increase of the time for the test can be suppressed by performing the multi-bit test, and in this test mode, the test of the operation margin can concurrently be performed. By performing the multi-bit test on the operation margin, in the correct operation, it is not necessary to read the test data for each 8 bits for determination. Therefore, there will be no problem with regard to the time for the test, even if the number of word bits decreases.

[Modification]

Figure 9:
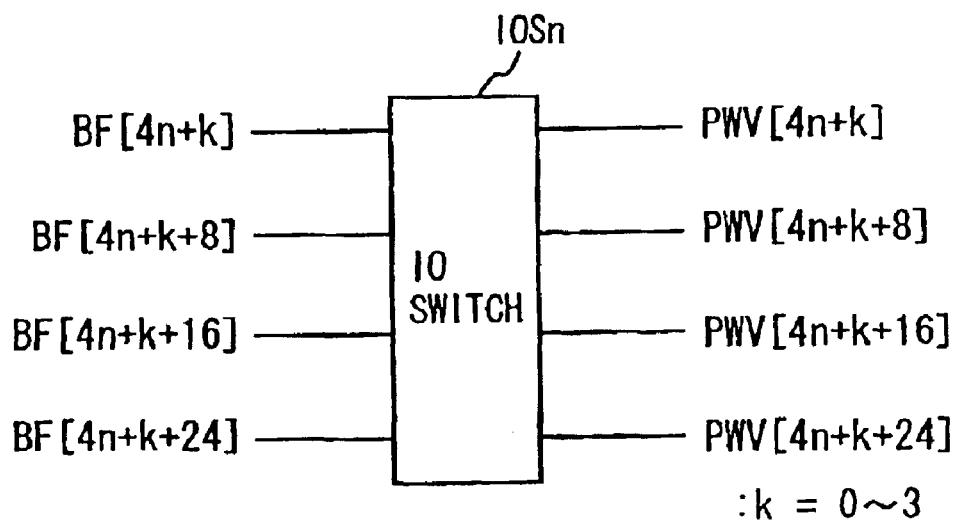
FIG. 9 schematically shows a configuration of an I/O switch in a modification of the first embodiment of the present invention.

FIG. 9 schematically shows a configuration of an I/O switch in a modification of the first embodiment of the present invention. An internal configuration of the I/O switch IOSn is the same as that of I/O switch IOSn shown in previous FIG. 2. This I/O switch IOSn, however, switches connection paths of preamplifiers/write drivers PWB[4$n$+k], PWB[4$n$+k+8], PWB[4$n$+k+16] and PWB[4$n$+k+24] and DQ buffers BF[4$n$+k], BF[4$n$+k+8], BF[4$n$+k+16] and BF[4$n$+k+24]. Here, k is an integer from 0 to 3.

Specifically, I/O switch IOSn switches the connection paths of four internal data lines spaced apart from each other by 8 IOs (internal data lines). Eight-bit data of IO lines <4$n$+k> and <4($n$+1)+k>(k=0–3) is transferred as read data Q<4$n$+7:4$n$> of adjacent 8 bits.

Figure 10:
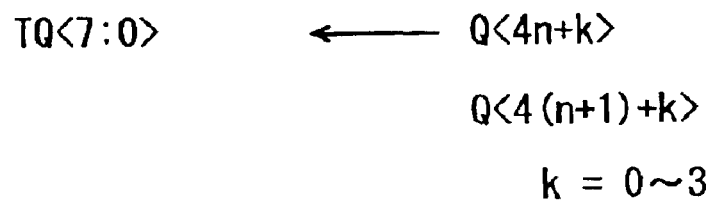
FIG. 10 shows a relation of test output data with DRAM core output data in the variation of the first embodiment of the present invention.

Therefore, as shown in FIG. 10, when data TQ<7:0> is output in a unit of 8 bits, test data TQ<7:0> is constituted of data bits Q<4$n$+k> and Q<4($n$+1)+k> with k being 0 to 3. Therefore, 8-bit test data TQ<7:0> is constituted either by all valid data bits or by all invalid data bits.

Figure 11:
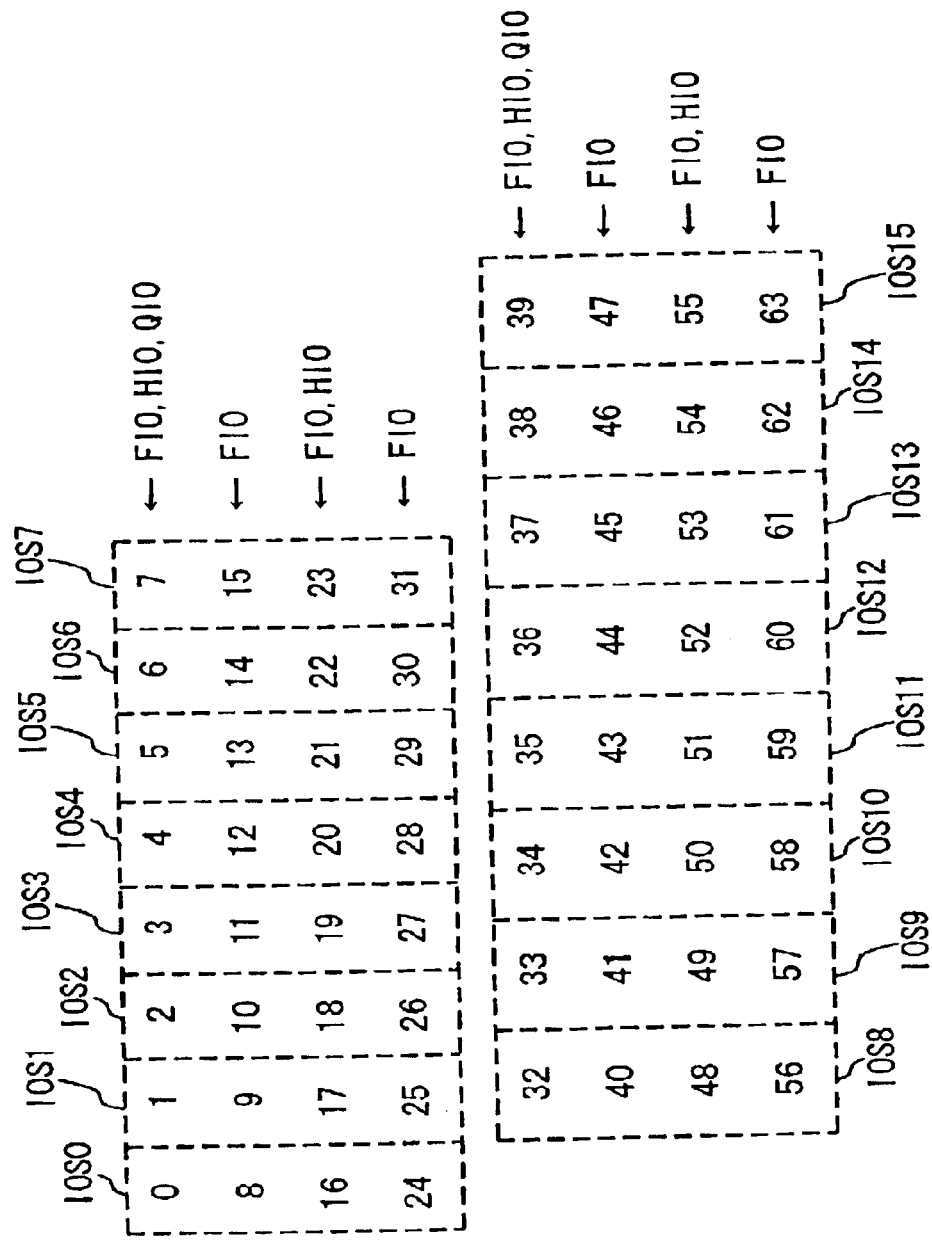
FIG. 11 shows a relation of the I/O switch with a corresponding internal data line in the modification of the first embodiment of the present invention.

FIG. 11 shows a set of associated internal data lines of the I/O switch in the present modification. FIG. 11 shows I/O switches IOS0 to IOS15. A number enclosed in each dashed line block in FIG. 11 indicates the internal data line (I/O). With regard to I/O switches IOS0 to IOS7, I/O switch IOSn switches the connection paths of internal data lines IOL<n+8·i>. Here, i is a number from 0 to 3. Meanwhile, with regard to I/O switches IOS8 to IOS15, I/O switch IOSn switches the connection paths of internal data lines IOL<4·n+8i>.

Therefore, in the half I/O mode, the valid data bits are output to data bits Q<7:0>, Q<23:16>, Q<39:32> and Q<55:48>, and remaining data bits are invalid.

In the quarter I/O mode, the valid data bits are output to data bits Q<7:0> and Q<39:32>. Therefore, in the tester, if a column address signal externally applied is varied in accordance with each I/O mode so that select signals QSEL<15:0> in the test interface circuit are generated in a thinned-out manner, only valid data bits can successively be output.

In the above-described configuration, IO lines of 64 bits are arranged in a memory array, and data of a total of 128 bits is transferred to and from two memory arrays. When IO lines of 128 bits are arranged in one memory array, however, the valid data are output to lower order 64 bits Q<63:0> in the half I/O mode, and the valid data are output to lower order 32 bits Q<31:0> in the quarter I/O mode, if I/O switch IOSn is configured so as to switch the connection of four internal data lines IOL<32·i+k> spaced apart from each other by 32 IO lines. Here, i is a number from 0 to 3, and k is an integer from 0 to 31.

Figure 12:
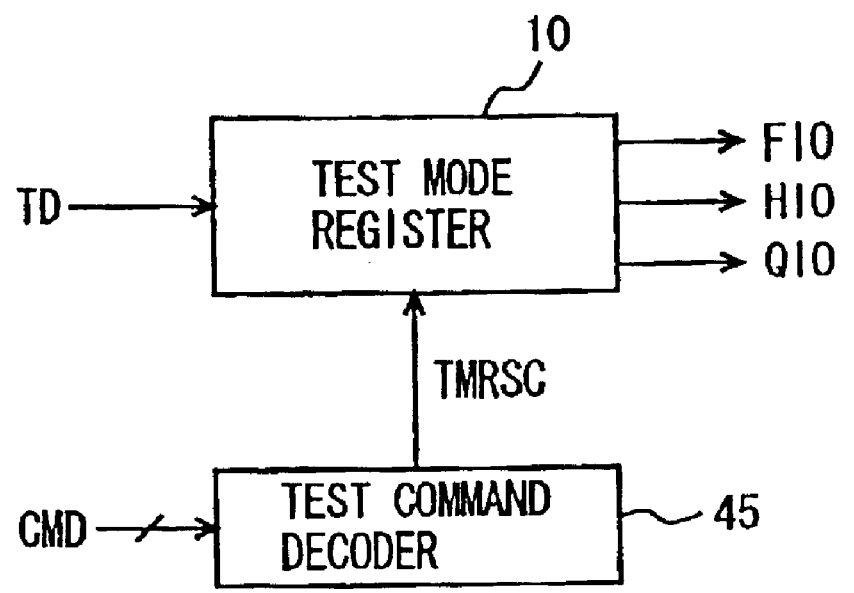
FIG. 12 schematically shows a configuration of a main portion of the test interface circuit in the first embodiment of the present invention.

FIG. 12 schematically shows a configuration of a main portion of test interface circuit (TIC) 512. In FIG. 12, test mode register 10 takes in test data supplied to a test data input terminal, in response to an activation of a test mode register set command TMRSC from a test command decoder 45, and generates I/O mode designating signals FIO, HIO and QIO.

The TIC control signals shown in FIG. 20 are applied to test command decoder 40 as a command CMD. Here, by combining a specific address signal, test mode register set command TMRSC is supplied. Thus, in the test mode, a desired I/O mode can be set in test mode register 10.

Test mode register 10 may be configured so as to fix these I/O mode designating signals FIO, HIO and QIO to L level when test mode instruction signal MTEST is in an inactive state of L level.

As described above, according to the first embodiment of the present invention, in the DRAM core having a word configuration variable, the DRAM core is operated with the word configuration set to an intended word configuration, irrespective of a fixedly set word configuration. Therefore, a function of the IO switches of the DRAM core and an operation margin of the DRAM core can sufficiently be tested, and the yield can be improved.

[Second Embodiment]

Figure 13:
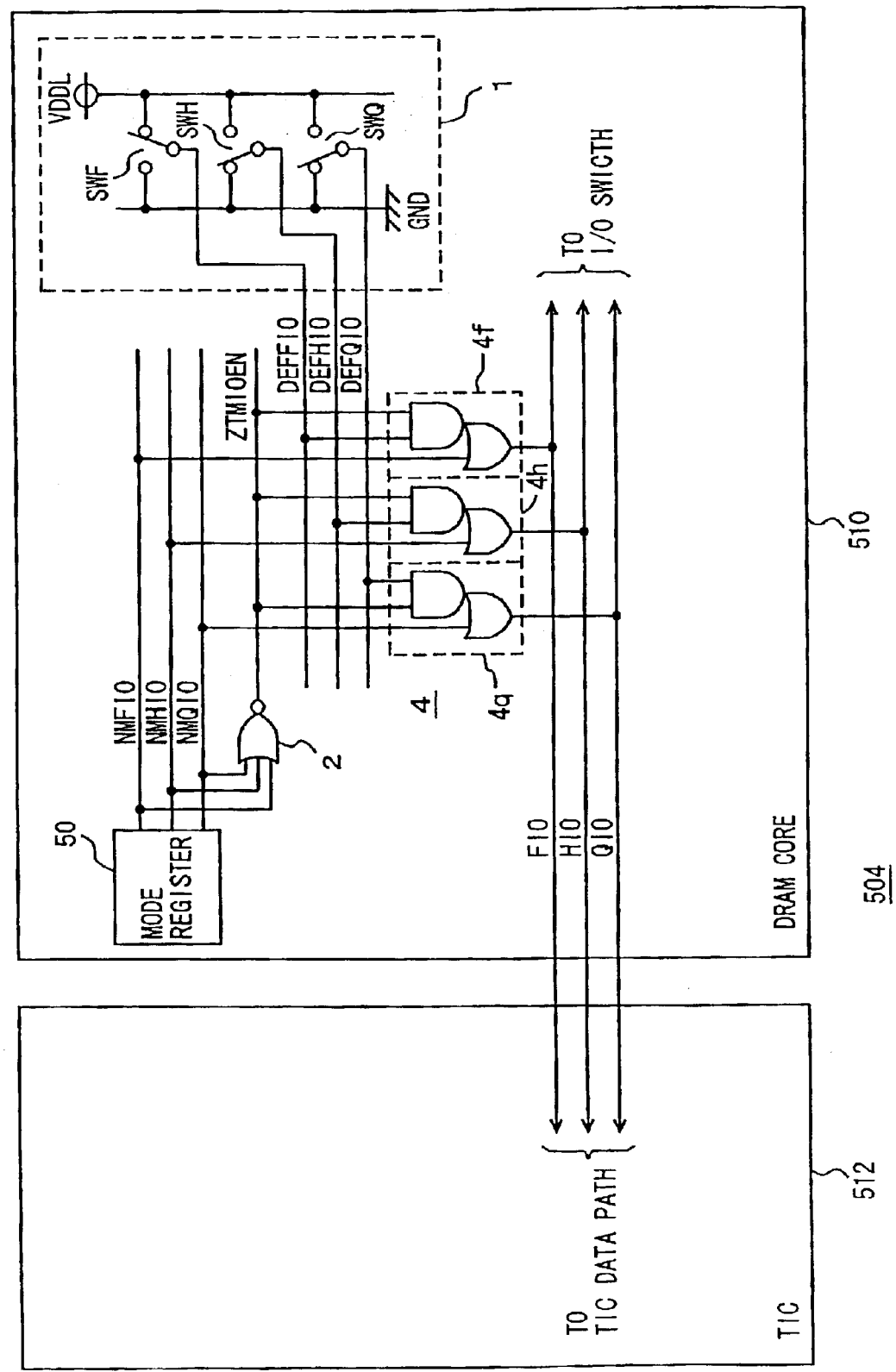
FIG. 13 shows a configuration of a main portion of a DRAM macro according to a second embodiment of the present invention.

FIG. 13 schematically shows a configuration of DRAM macro 504 according to the second embodiment of the present invention. In DRAM macro 504 shown in FIG. 13, information of setting the number of IOs (word configuration) is set in a mode register 50 provided in DRAM core 510. Since other configuration of DRAM core 510 is the same as that of DRAM core 510 shown in FIG. 1, same reference characters are allotted to corresponding components, and detailed description thereof will not be repeated.

In addition, a configuration of an I/O switch for switching a connection of internal data lines arranged in DRAM core 510 is the same as in the first embodiment. Test mode register 10 for setting the word configuration is not provided in test interface circuit 512. Other configuration of test interface circuit 512 is the same as that shown in previous FIG. 8, except that a test mode register for setting the word configuration is not provided. Note that a test mode register may be used in an application other than setting of a word configuration in test interface circuit 512.

In the configuration shown in FIG. 13, mode register 50 can have storage contents set from a logic in a normal operation mode. In the test mode, test interface circuit 512 sets the storage contents of mode register 50 via select circuit 517 (shown in FIG. 17). With data bit number designating information set into mode register 50, one of a full IO mode designating signal NMFIO instructing the full I/O mode, a half IO mode designating signal NMHIO designating the half I/O mode, and quarter IO mode designating signal NMQIO designating the quarter I/O mode is activated.

In the test mode, by setting information instructing the word configuration in mode register 50 arranged in DRAM core 510, a test by switching the I/O modes can be performed in a manner similar to the first embodiment.

In addition, mode register 50 arranged in DRAM 510 is used to generate word configuration designating signals (IO mode designation signals) NMFIO, NMHIO and NMQIO.

Thus, it is not necessary to embed a plurality of DRAM cores in accordance with each word configuration, when a plurality of user logics having different word configurations are embedded in the same system LSI.

Figure 14:
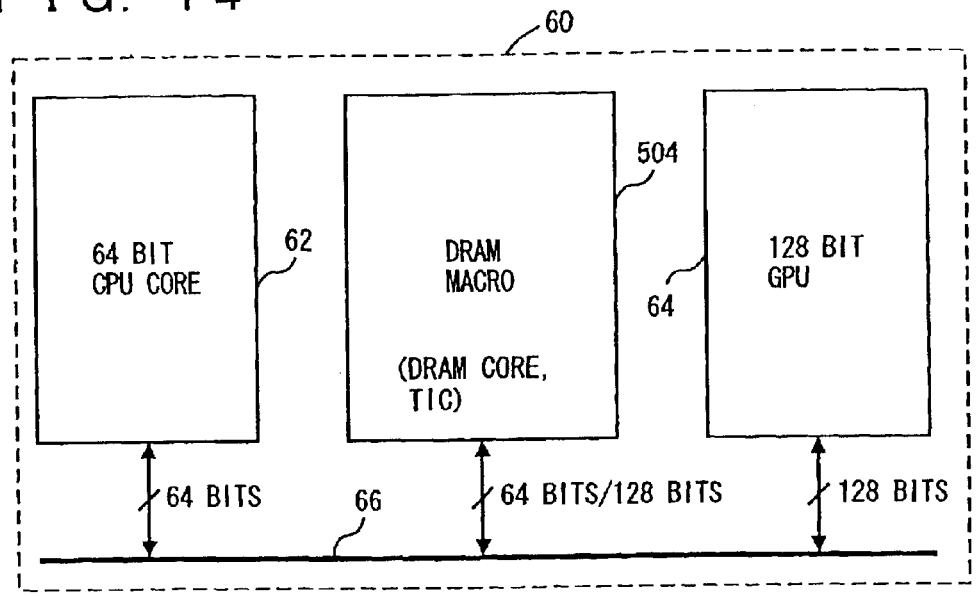
FIG. 14 shows an example of a configuration of a system LSI including the DRAM macro according to the second embodiment of the present invention.

FIG. 14 schematically shows an example of a configuration of a system LSI with the DRAM macro embedded, according to the second embodiment of the present invention. In FIG. 14, a system LSI 60 includes DRAM macro 504, a CPU core 62 executing a normal application program, and a graphic processor (GPU) 64 for exclusively performing image processing. CPU core 62, GPU 64 and DRAM macro 504 are integrated on the same semiconductor chip.

CPU core 62, DRAM macro 504 and GPU 64 are interconnected via an internal common data bus 66. CPU core 62 transfers 64-bit data, and GPU 64 transfers 128-bit data. In other words, the word configuration of the process data of CPU core 62 is of 64 bits, and that of GPU is of 128 bits.

In the construction shown in FIG. 14, CPU core 62 makes an access to DRAM macro 504 in the half I/O mode, and GPU 64 makes an access to DRAM macro 504 in the full I/O mode. Therefore, CPU core 62 and GPU 64 can make an access to DRAM macro (DRAM core) 504 in common. Accordingly, data is easily communicated between CPU core 62 and GPU 64, and system performance can be improved.

In addition, it is not necessary to arrange a dedicated buffer memory for communicating data between CPU 62 and GPU 64, and to provide a plurality of DRAM cores in accordance with the word configuration. Therefore, a peripheral circuit for CPU core 62 and GPU 64 is unified, and a system area by system LSI 60 can be made smaller, leading to reduction of the chip cost.

In an access of CPU core 62 and GPU 64 to DRAM core 504, with the full I/O mode being set as a default value in metal word configuration setting circuit 1, CPU 62 different from in word configuration the full I/O mode may be configured to set information designating the I/O mode in the mode register for making an access to DRAM core 504. Conversely, when the half I/O mode is set as a default value in metal word configuration setting circuit 1, GPU 64 may be configured to set information designating the word configuration in mode register 50 for making an access to DRAM core 504.

Moreover, the number of logics making an access to DRAM core 504 is not limited to two, and three or more logics may be integrated on the same semiconductor chip as DRAM core 504.

Further, the number of I/O modes is not limited to three, and an appropriate number thereof can be set in accordance with the configuration of DRAM core 504.

Figure 15:
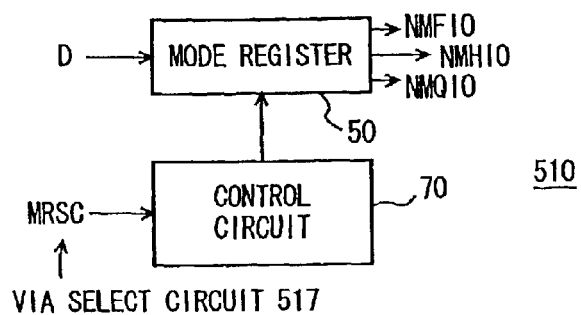
FIG. 15 schematically shows a configuration of a mode register control portion in the second embodiment of the present invention.

FIG. 15 schematically shows a configuration of a portion setting word configuration information for mode register 50 shown in FIG. 13. In FIG. 15, in DRAM core 510, a control circuit 70 causes mode register 50 to take in data D constituted of a prescribed number of data bits in accordance with a mode register set command MRSC supplied via select circuit 517 shown in FIG. 17. Data D is constituted of 3-bit data, for example. In order to set word configuration designating signals NMFIO, NMHIO and NMQIO, an address signal bit may be used instead of data D.

Figure 17:
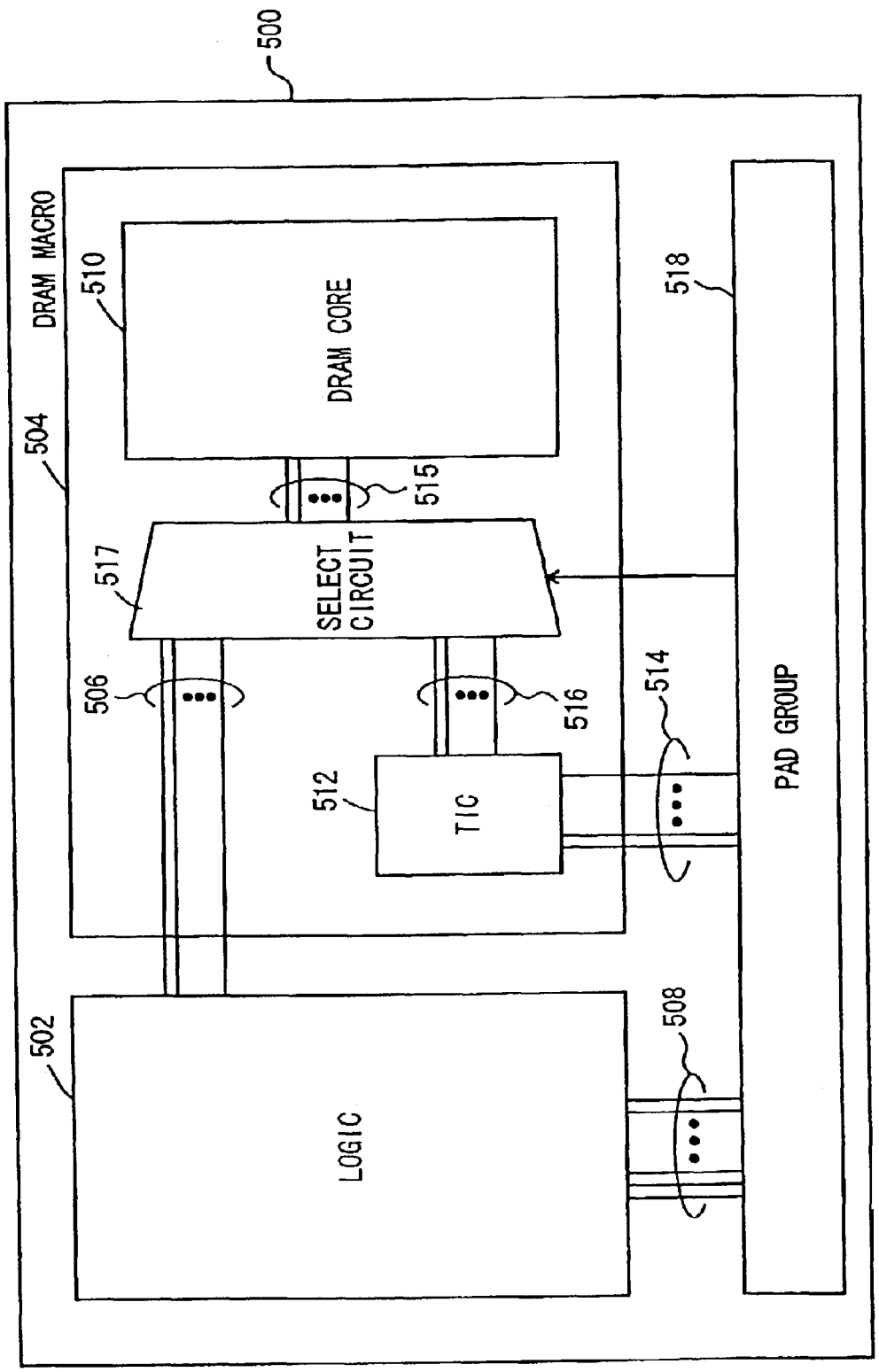
FIG. 17 schematically shows a configuration of a conventional system LSI.
Figure 21:
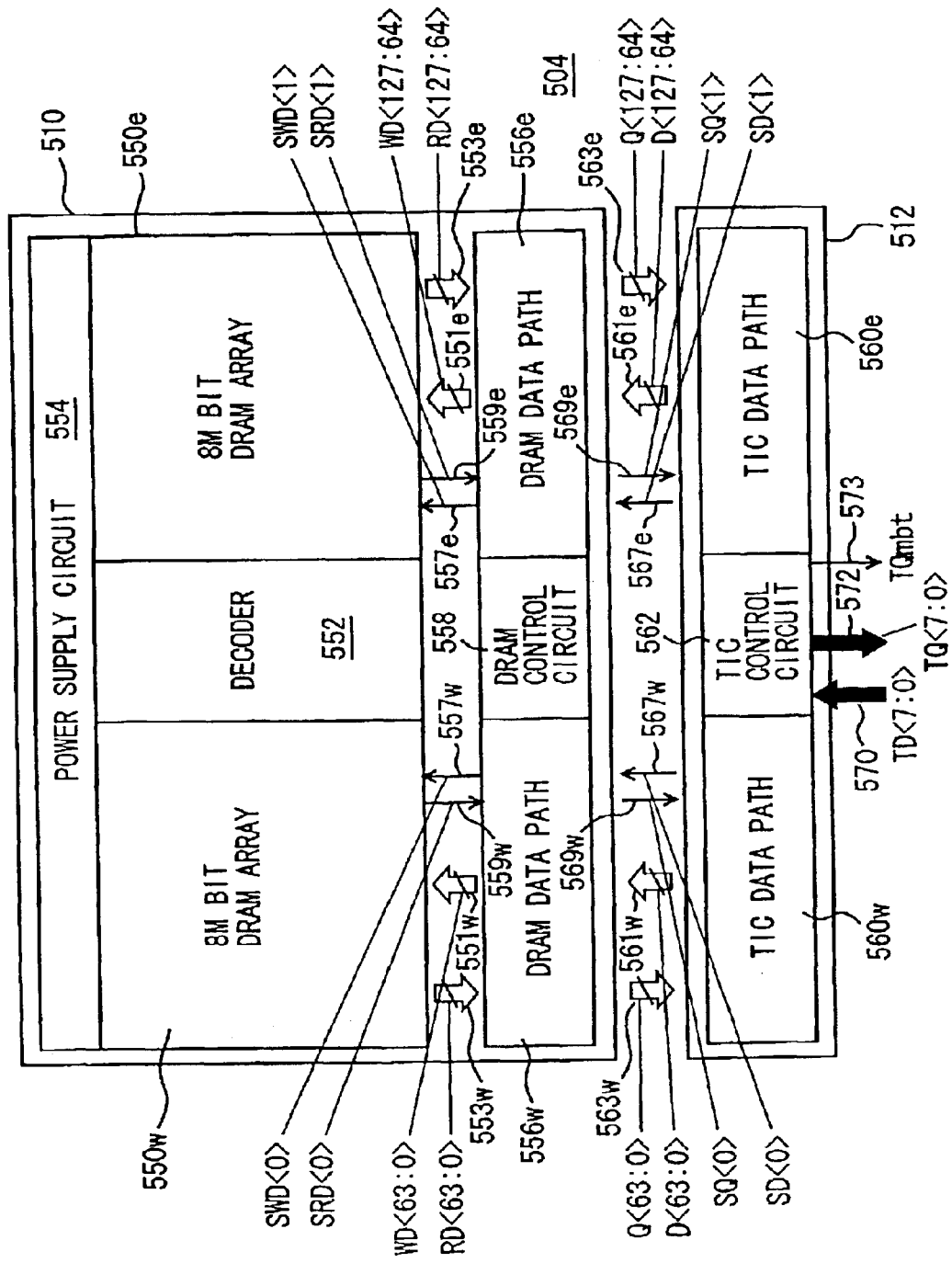
FIG. 21 shows a specific configuration of a conventional DRAM macro.
Figure 22:
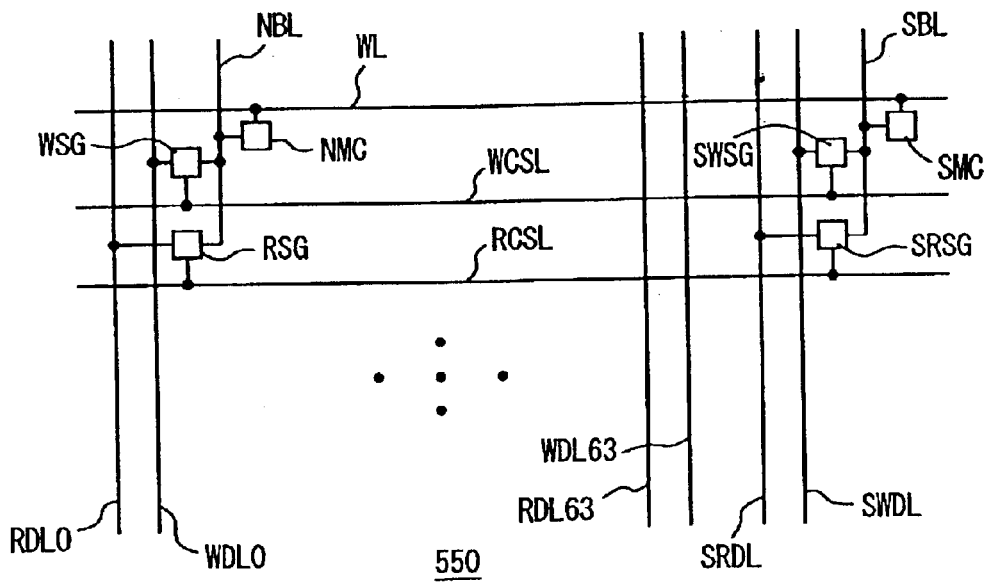
FIG. 22 schematically shows a configuration of a DRAM array shown in FIG. 21.
Figure 23:
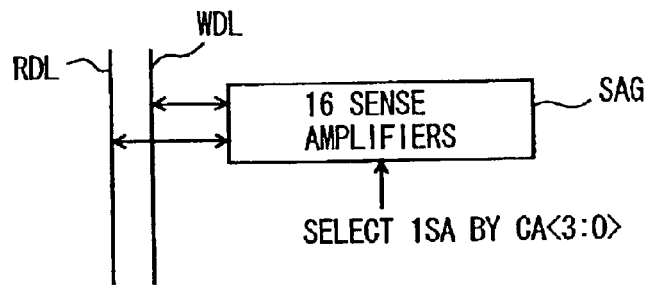
FIG. 23 schematically shows a relation of an internal data line with a sense amplifier shown in FIG. 22.
Figure 24:
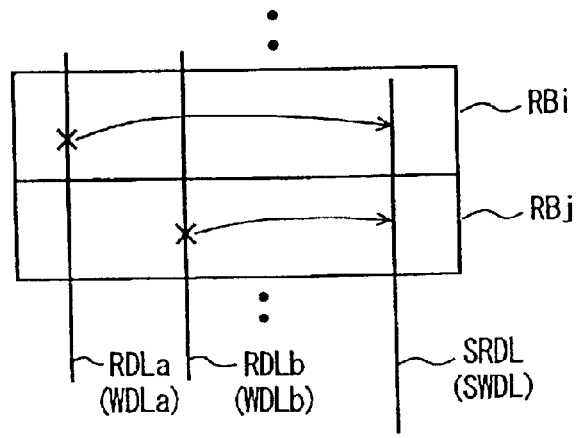
FIG. 24 shows an example of redundancy replacement of the DRAM array shown in FIG. 21.

Since mode register set command MRSC supplied to control circuit 70 is supplied via select circuit 517 shown in FIG. 17, a mode register set command is supplied together with the word configuration setting data in the test operation mode under the control of the external tester via the test interface circuit (TIC).

In the normal operation mode, mode register set command MRSC is supplied from a user logic such as CPU core 62 and GPU 64 shown in FIG. 14. In the normal operation mode, the word configuration of DRAM core 510 can be set in accordance with that of the user logic, and DRAM core 510 can be operated with a word configuration different from the default value (an I/O mode set in the metal word configuration setting circuit) of DRAM core 510.

In the configuration of the system LSI shown in FIG. 14, as one example, the full I/O mode is set in metal word configuration setting circuit 1 shown in FIG. 13, and GPU 64 transfers 128-bit data. On the other hand, CPU core 62 supplies mode register set command MRSC in accessing, and stores information setting the half I/O mode in mode register 50. Thus, half IO designating signal NMHIO is activated in mode register 50, and DRAM core 510 is accessed in the half I/O mode.

In such a case, CPU 62 needs to reset the stored data in mode register 50 after completion of the access and before the access of GPU 64. Alternatively, such a configuration may be used, in which, when read operation instruction signal /RE or write operation instruction signal /WR shown in FIG. 11 is supplied from CPU 62 to DRAM core 510, an unused column address signal bit is used to store a word configuration designating data in mode register 50, and when a row inactivating signal /PRE is applied to DRAM 510, the stored data in mode register 50 is reset.

In this configuration, it is not particularly necessary to provide a mode register set cycle for setting a word configuration for mode register 50, separately from an access cycle, and access efficiency is improved. DRAM core 504, however, needs to determine whether it is CPU core 62 or GPU 64 that is making an access. In order to eliminate such determination operation, unused column address signal bits CA<12:10> in both CPU and GPU may be used to designate respective I/O modes when CPU 62 and GPU 64 are each making an access, and information indicating a used word configuration may be set in mode register 50.

[Modification]

Figure 16:
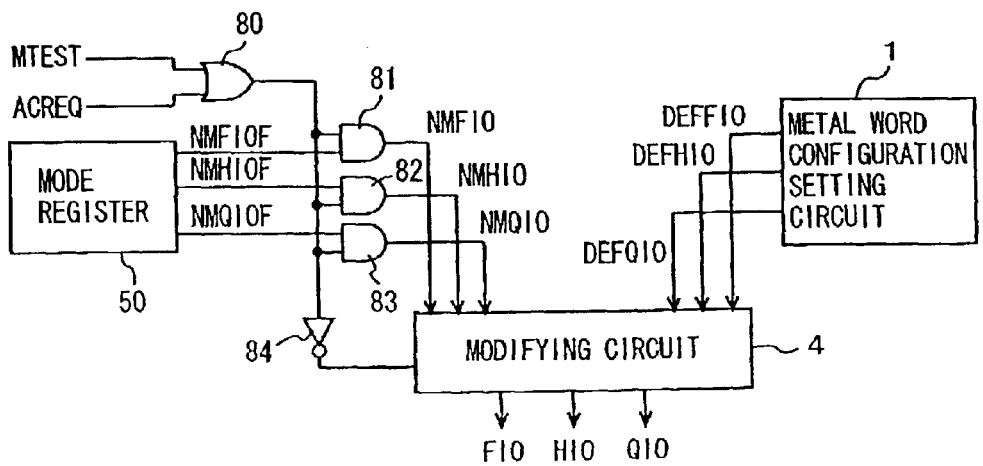
FIG. 16 schematically shows a modification of the second embodiment of the present invention.

FIG. 16 schematically shows a configuration of a main portion of a modification of the second embodiment of the present invention. In FIG. 16, in order to set the word configuration, following components are provided: an OR gate 80 receiving test mode instruction signal MTEST and an access request signal ACREQ; an AND gate 81 receiving a full IO designating fast signal NMFIOF stored in mode register 50 and an output signal of OR gate 80 to generate normal-mode full IO designating signal NMFIO; an AND gate 82 receiving a half IO designating fast signal NMHIOF stored in mode register 50 and the output signal of OR gate 80 to generate normal-mode half IO designating signal NMHIO; an AND gate 83 receiving a normal-mode quarter IO designating fast signal NMQIOF stored in mode register 50 to generate normal-mode quarter IO designating NMQIO; and an inverter 84 inverting the output signal of OR gate 80.

Metal word configuration setting circuit 1 and modifying circuit 4 have the same configuration as metal word configuration setting circuit 1 and modifying circuit 4 shown in FIG. 13, respectively. Therefore, modifying circuit 4 selects IO designating signals DEFFIO, DEFHIO and DEFQIO of the default value from metal word configuration setting circuit 1, when an output signal of inverter 84 is at H level. On the other hand, when test instruction signal MTEST is set to H level in the test mode, the output signal of OR gate 80 is set to H level, and AND gates 81 to 83 operate as buffer circuits. In such a state, modifying circuit 4 generates IO designating signals FIO, HIO and QIO in accordance with information set in mode register 50.

When access request signal ACREQ is generated in the normal operation mode, modifying circuit 4 similarly generates IO designating signals FIO, HIO and QIO in accordance with the information stored in mode register 50. In the normal operation mode, when access request signal ACREQ is at L level, modifying circuit 4 generates IO designating signals FIO, HIO and QIO in accordance with the default value set by metal word configuration setting circuit 1.

In the system LSI having the configuration shown in FIG. 14, access request signal ACREQ is set to H level when CPU core 62 makes an access to DRAM core 504. Meanwhile, access request signal ACREQ is set to L level in the access of GPU 64.

As access request signal ACREQ, a signal corresponding to chip select signal /CS is internally copied in CPU 62, and transferred to DRAM macro 504 via a dedicated signal line. Thus, also in the configuration in which GPU 64 and CPU core 62 supply the signal corresponding to chip select signal /CS to DRAM macro 504 using a common signal line, the dedicated signal line is separated from the common signal lines. Therefore, it is ensured that access request signal ACREQ can be activated only during the access of CPU core 62. Note that a signal of a logical sum of read activation signal /RE and write activation signal /WE may be used as access request signal ACREQ.

In addition, in the configuration shown in FIG. 16, modifying circuit 4 may be constituted with a select circuit such as a multiplexer. When modifying circuit 4 is constituted with the select circuit, AND gates 81 to 83 can be removed, and either one of an output signal of mode register 50 and an output signal of metal word configuration setting circuit 1 is selected in accordance with the output signal of inverter 80. When modifying circuit 4 is constituted with a multiplexer, it is not necessary to reset mode register 50 at the completion of access with the word configuration different from the default value, and access efficiency is improved.

By utilizing OR gate 80, it is not necessary to use the mode register set command to set the word configuration information in mode register 50, and to reset mode register 50 after the completion of access, when DRAM core 504 is accessed with the word configuration different from the default value set in metal word configuration setting circuit 1. Thus, access efficiency is improved.

As described above, according to the second embodiment of the present invention, information for setting the word configuration can be stored in the mode register normally provided in the DRAM core, and the user logics having different word configurations can be coupled in common to the DRAM core. In addition, the chip area of the system LSI including processors different in word configuration from each other can be reduced, and data can be shared by the plurality of user logics. Thus, process efficiency can be improved.

[Another Application]

In the above-described description, although the word configurations are switched between 128 bits, 64 bits and 32 bits, the word configuration is not limited thereto. For example, 256 bits or 512 bits can be used for the word configuration in the full I/O mode.

Although the DRAM macro mounted together with logics has been described, the present invention is applicable to a semiconductor memory device, as far as the word configuration thereof can be varied with the metal slice.

As described above, according to the present invention, the word configuration fixed by the metal slice of the DRAM macro is made variable, and the word configuration of the DRAM macro can be set to a desired configuration in accordance with an operation mode. Thus, the DRAM macro can directly be accessed using the external tester in the test, and can be operated under an actual use condition. In addition, the operation margin and the function of the IO switches can accurately be tested.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:

a plurality of internal data lines;

a plurality of internal write/read circuits, arranged corresponding to said plurality of internal data lines, each activated in response to a select signal, and communicating data with a corresponding internal data line when activated;

a plurality of data input/output circuits arranged, corresponding to said plurality of internal write/read circuits, each selectively set operable in accordance with data bit number designating information and activated in response to a data access instruction signal when set operable, and communicating data with a corresponding internal write/read circuit when activated, said data bit number designating information being externally variable;

a connection circuit including a switching circuit for electrically setting a connection path between said plurality of internal write/read circuits and said plurality of data input/output circuits in accordance with said data bit number designating information, for connecting said plurality of internal write/read circuits with said plurality of data input/output circuits; and a path setting circuit for setting the connection path of said switching circuit in accordance with said data bit number designating information, said connection path being variable in accordance with said data bit number designating information.

2. The semiconductor integrated circuit device according to claim 1, wherein said connection circuit sets the connection path between said plurality of data input/output circuits and said plurality of internal write/read circuits in a unit of a set of a prescribed number of data input/output circuits, and a manner of connection of said switching circuit is identical in each set.

3. The semiconductor integrated circuit device according to claim 1, wherein said path setting circuit includes a fix circuit for generating first data bit number designating information in a fixed manner, and a modifying circuit receiving second data bit number designating information externally supplied, and invalidating the first data bit number designating information output by said fix circuit and validating said second data bit number designating information in accordance with the received second data bit number designating information, for transference to said connection circuit.

4. The semiconductor integrated circuit device according to claim 1, further comprising a test interface circuit receiving in parallel data output from said plurality of data input/output circuits, and supplying the data externally in a unit of a prescribed number of bits in a test operation mode.

5. The semiconductor integrated circuit device according to claim 4, wherein said path setting circuit includes
a fix circuit for generating first data bit number designating information in a fixed manner,
a storage circuit arranged in said test interface circuit, and storing test mode data bit number designating information applied externally, and
a modifying circuit receiving the test mode data bit number designating information from said storage circuit, and transferring said test mode data bit number designating information to said connection circuit instead of the first data bit number designating information output by said fix circuit.

6. The semiconductor integrated circuit device according to claim 1, wherein said path setting circuit includes
a fix circuit for generating first data bit number designating information in a fixed manner,
a storage circuit storing second data bit number designating information applied externally, and having storage content externally settable in a normal operation mode, and
a modifying circuit receiving the second data bit number designating information from said storage circuit, and transferring said second data bit number designating information to said connection circuit in place of the first data bit number designating information output by said fix circuit.

7. The semiconductor integrated circuit device according to claim 1, further comprising a logic circuit transferring data to and from the data input/output circuits to perform a prescribed processing in a normal operation mode.

8. The semiconductor integrated circuit device according to claim 7, wherein said path setting circuit includes
a fix circuit for generating first data bit number designating information in a fixed manner,
a storage circuit for storing second data bit number designating information, and having storage content settable by said logic circuit in a normal operation mode, and
a modifying circuit receiving the second data bit number designating information from said storage circuit, and transferring said second data bit number designating information to said connection circuit in place of the first data bit number designating information output by said fix circuit.

9. The semiconductor integrated circuit device according to claim 8, further comprising a test interface circuit receiving in parallel data from said plurality of data input/output circuits, and supplying the data externally in a unit of a prescribed number of bits in a test operation mode; and a multiplexer for transferring at least test write data from said test interface circuit to the input/output circuits instead of said logic circuit in said test operation mode; wherein
storage content of said storage circuit is set in accordance with information transferred via said test interface circuit in said test operation mode.

10. The semiconductor integrated circuit device according to claim 1, further comprising a test interface circuit for transferring data transferred from said plurality of data input/output circuits externally in a unit of a predetermined number of bits; wherein said test interface circuit includes a compression circuit receiving data output from said plurality of data input/output circuits, comparing the received data with expected value data, and compressing a result of comparison into 1-bit data, and
said compression circuit includes a circuit for setting a comparison result for data from a prescribed input/output circuit to a state indicating a match in accordance with said second data bit number designating information.

* * * * *